US011355421B2

(12) United States Patent
 Shiraiwa

(10) Patent No.: US 11,355,421 B2
(45) Date of Patent: Jun. 7, 2022

(54) SEMICONDUCTOR DEVICE, MANUFACTURING METHOD FOR SEMICONDUCTOR, AND IMAGING UNIT

(71) Applicant: SONY SEMICONDUCTOR SOLUTIONS CORPORATION, Kanagawa (JP)

(72) Inventor: Toshiaki Shiraiwa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/761,716

(22) PCT Filed: Oct. 18, 2018

(86) PCT No.: PCT/JP2018/038807
 § 371 (c)(1),
 (2) Date: May 5, 2020

(87) PCT Pub. No.: WO2019/097949
 PCT Pub. Date: May 23, 2019

(65) Prior Publication Data
 US 2020/0335426 A1     Oct. 22, 2020

(30) Foreign Application Priority Data

Nov. 14, 2017  (JP) .............................. JP2017-219120

(51) Int. Cl.
  *H01L 21/768*  (2006.01)
  *H01L 23/48*  (2006.01)
  (Continued)

(52) U.S. Cl.
  CPC ...... *H01L 23/481* (2013.01); *H01L 21/76898* (2013.01); *H01L 27/14634* (2013.01); *H01L 27/14636* (2013.01); *H01L 21/3065* (2013.01)

(58) Field of Classification Search
  CPC ............. H01L 27/146; H01L 27/14634; H01L 27/14636; H01L 23/48; H01L 23/481;
  (Continued)

(56) References Cited

U.S. PATENT DOCUMENTS

2006/0278331 A1  12/2006 Dugas et al.
2007/0096329 A1*  5/2007 Suzuki .................. H01L 24/13
                                      257/774
2007/0290300 A1* 12/2007 Kawakami ........ H01L 21/76898
                                      257/621
(Continued)

FOREIGN PATENT DOCUMENTS

CN  101258593 A  9/2008
CN  101937894 A  1/2011
(Continued)

OTHER PUBLICATIONS

International Search Report and Written Opinion of PCT Application No. PCT/JP2018/038807, dated Dec. 25, 2018, 12 pages of ISRWO.

*Primary Examiner* — Chuong A Luu
(74) *Attorney, Agent, or Firm* — Chip Law Group

(57) ABSTRACT

A semiconductor device that includes a through hole forming region, an insulating wall, a semiconductor substrate, a side wall insulating film, and an electric conductor. The insulating wall has an inner peripheral surface surrounding the through hole forming region. The semiconductor substrate has the insulating wall buried in one of surfaces thereof. The semiconductor substrate has a through hole whose side wall is provided outwardly from the inner peripheral surface of the insulating wall. The side wall insulating film covers the side wall of the through hole and the inner peripheral surface of the insulating wall. The electric conductor is provided in the through hole of the semiconductor substrate via the side wall insulating film.

11 Claims, 22 Drawing Sheets

(51) Int. Cl.
*H01L 27/146* (2006.01)
*H01L 21/3065* (2006.01)

(58) Field of Classification Search
CPC ............. H01L 21/768; H01L 21/76898; H01L 21/3065; H01L 27/1469; H01L 25/07; H01L 25/18; H01L 25/065
USPC ........................................................ 257/621
See application file for complete search history.

(56) References Cited

U.S. PATENT DOCUMENTS

| | | | |
|---|---|---|---|
| 2010/0327383 | A1 | 12/2010 | Hayasaki et al. |
| 2013/0089701 | A1 | 4/2013 | Hooper et al. |
| 2013/0099349 | A1 | 4/2013 | Nomachi |
| 2014/0054774 | A1* | 2/2014 | Uchida ................. H01L 23/481 257/751 |
| 2014/0225266 | A1 | 8/2014 | Mitsuhashi |
| 2014/0291841 | A1 | 10/2014 | Mitsuhashi |
| 2015/0155223 | A1* | 6/2015 | Nomachi ............ H01L 21/3213 257/506 |
| 2015/0270307 | A1 | 9/2015 | Umebayashi et al. |
| 2016/0211225 | A1* | 7/2016 | Masuko ................ H01L 23/562 |

FOREIGN PATENT DOCUMENTS

| | | |
|---|---|---|
| CN | 103946959 A | 7/2014 |
| CN | 103946962 A | 7/2014 |
| CN | 104718622 A | 6/2015 |
| JP | 2008-547206 A | 12/2008 |
| JP | 2011-009645 A | 1/2011 |
| JP | 2012-209440 A | 10/2012 |
| JP | 2013-89816 A | 5/2013 |
| JP | 2013-105956 A | 5/2013 |
| JP | 2014-41879 A | 3/2014 |
| JP | 2014-099582 A | 5/2014 |
| JP | 2014-22637 A | 6/2014 |
| JP | 2014-154722 A | 8/2014 |
| JP | 2014-158048 A | 8/2014 |
| JP | 2015-501531 A | 1/2015 |
| KR | 10-2008-0017372 A | 2/2008 |
| KR | 10-2014-0088078 A | 7/2014 |
| KR | 10-2015-0066527 A | 6/2015 |
| TW | 201117346 A | 5/2011 |
| TW | 201316396 A | 4/2013 |
| TW | 201417255 A | 5/2014 |
| WO | 2013/052215 A2 | 4/2013 |
| WO | 2013/073573 A1 | 5/2013 |

* cited by examiner

[FIG. 1]
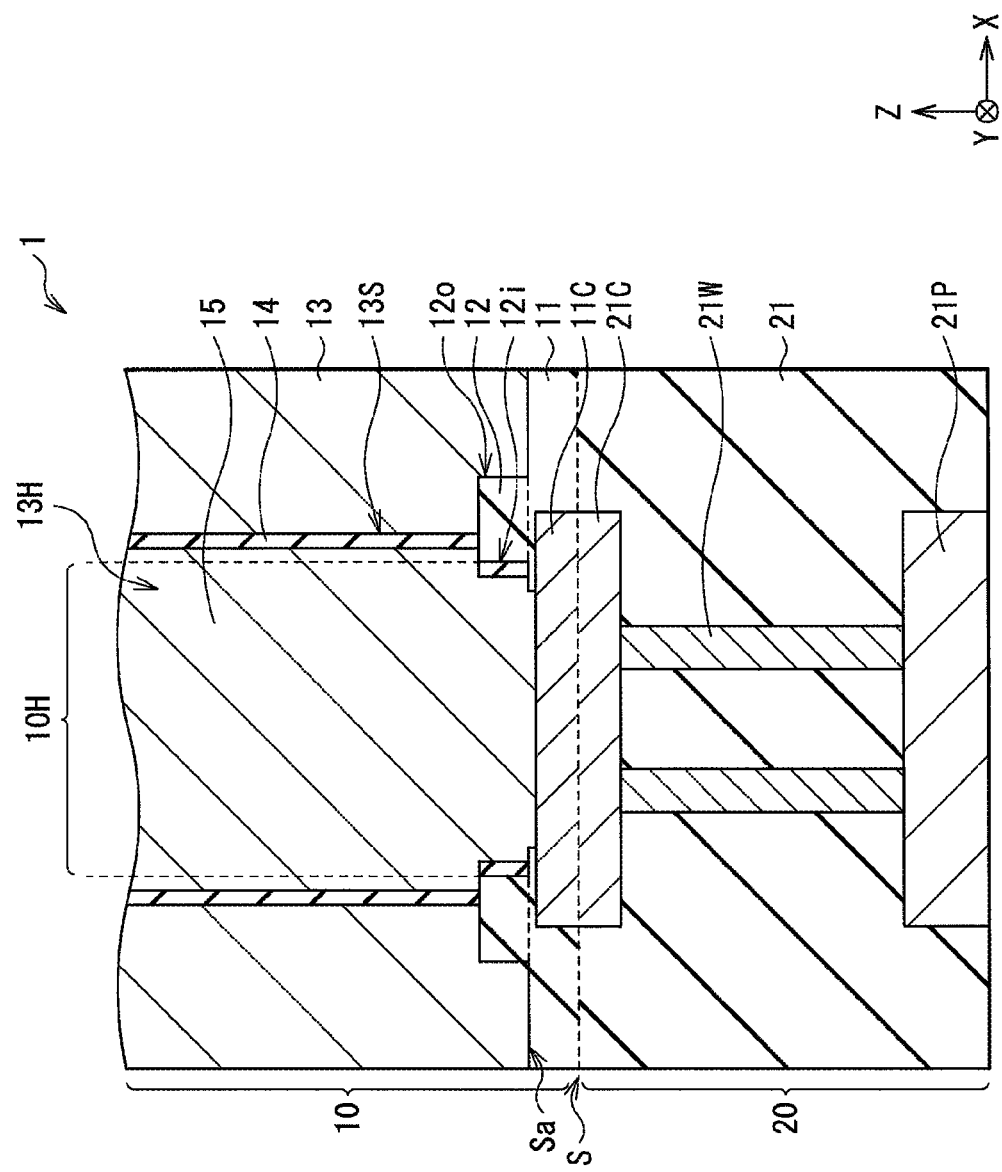

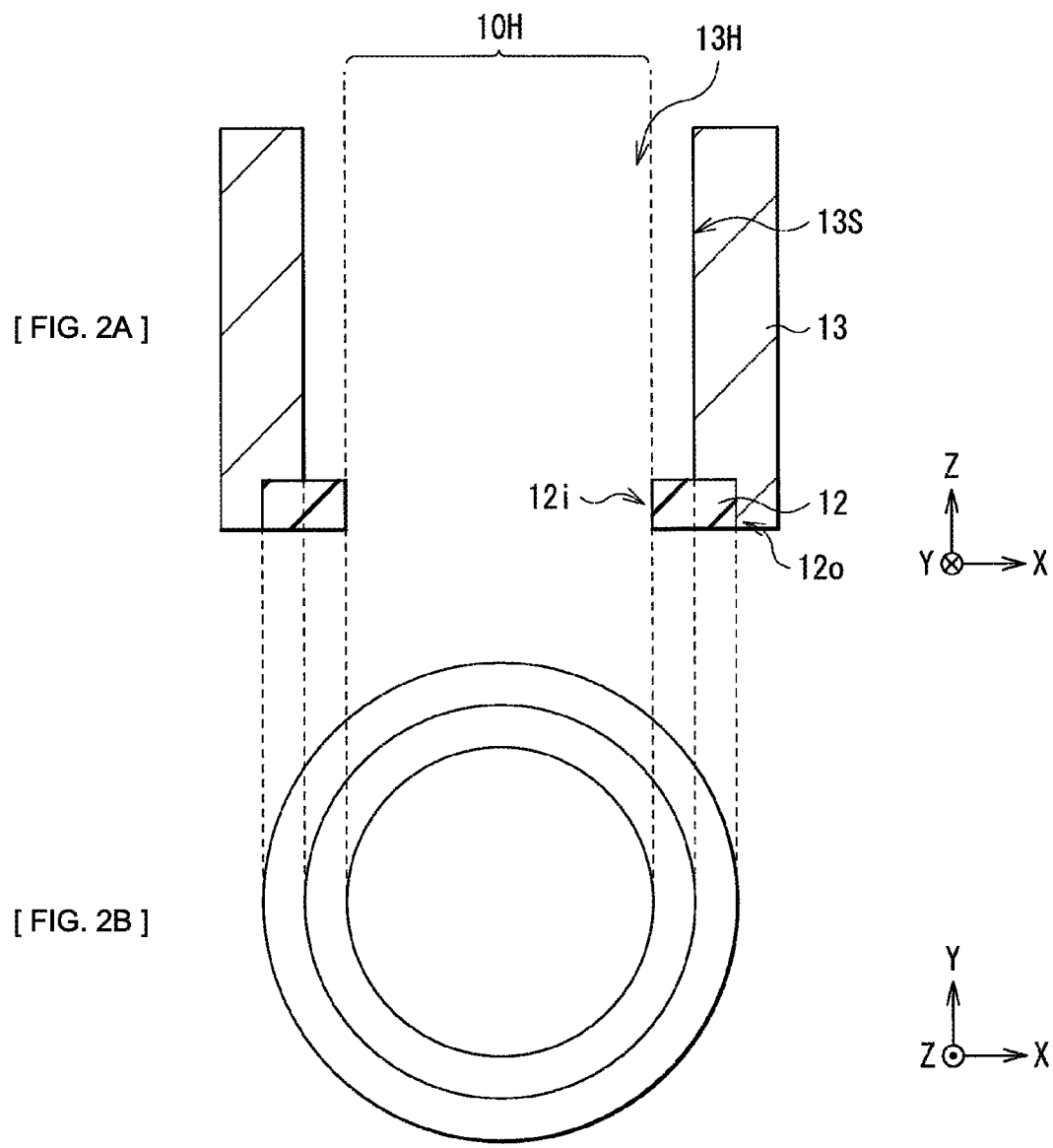

[ FIG. 3A ]
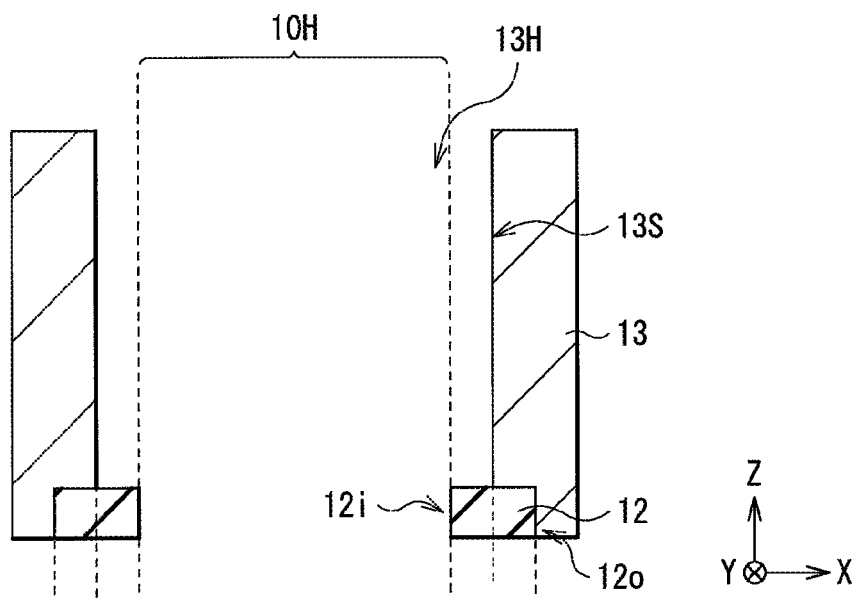
[ FIG. 3B ]
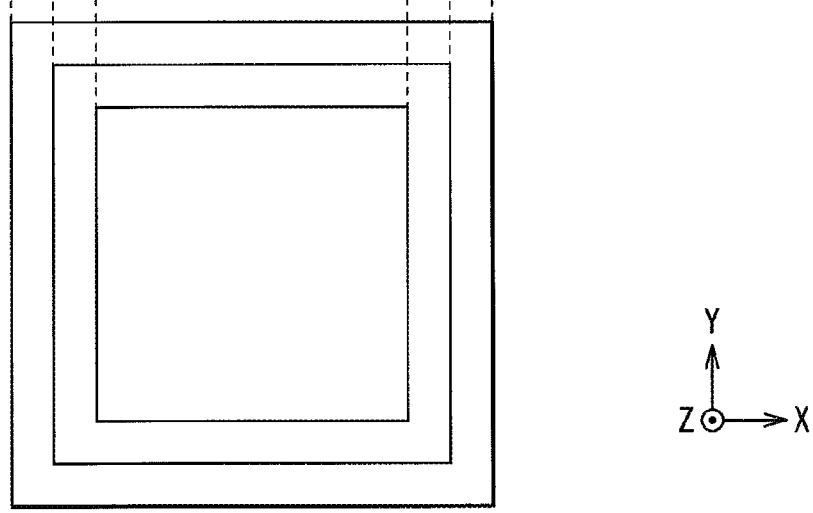

[FIG. 4]
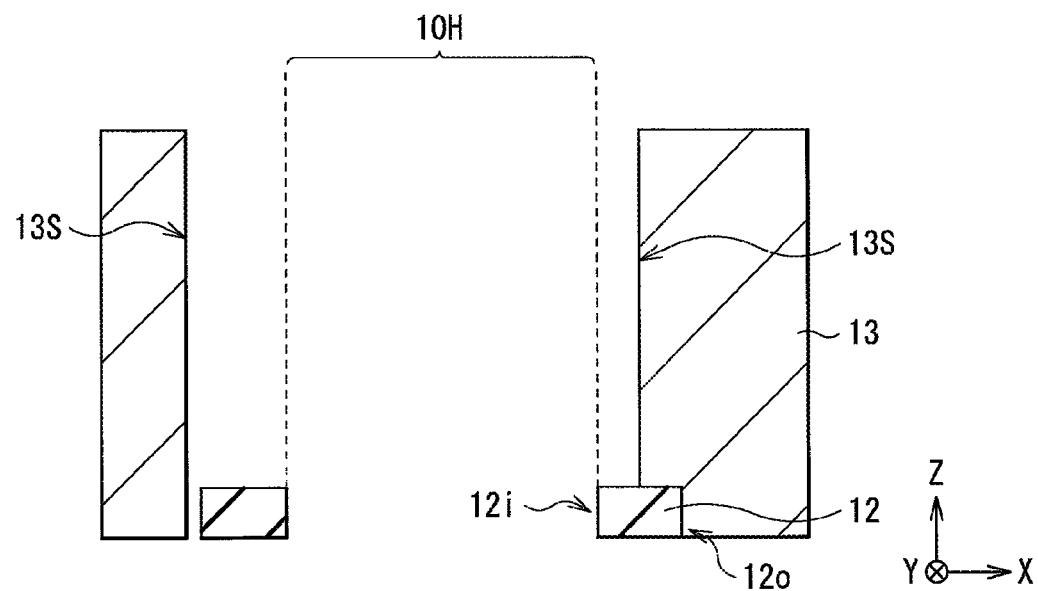
[FIG. 5]
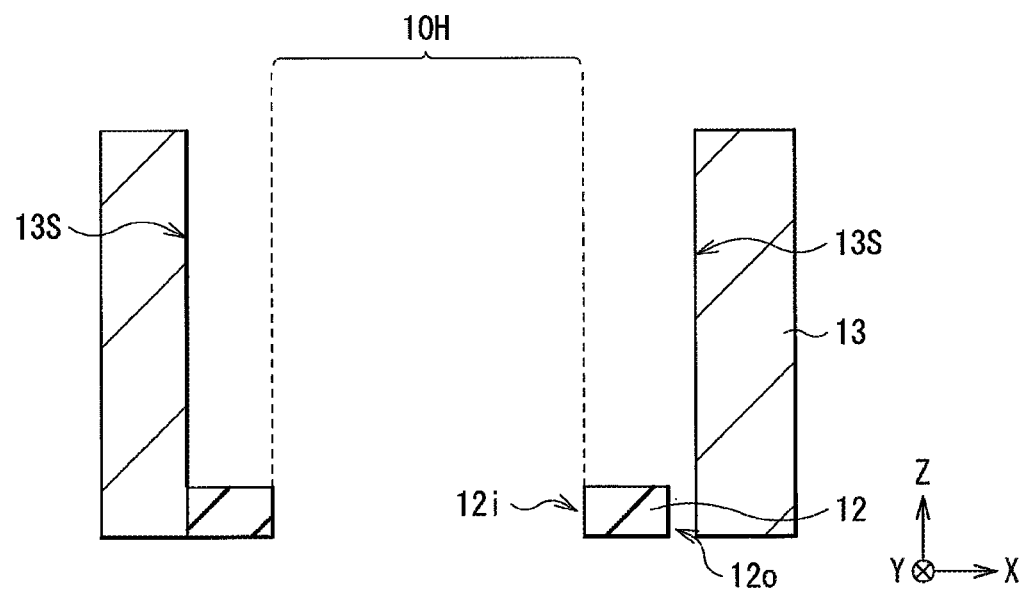

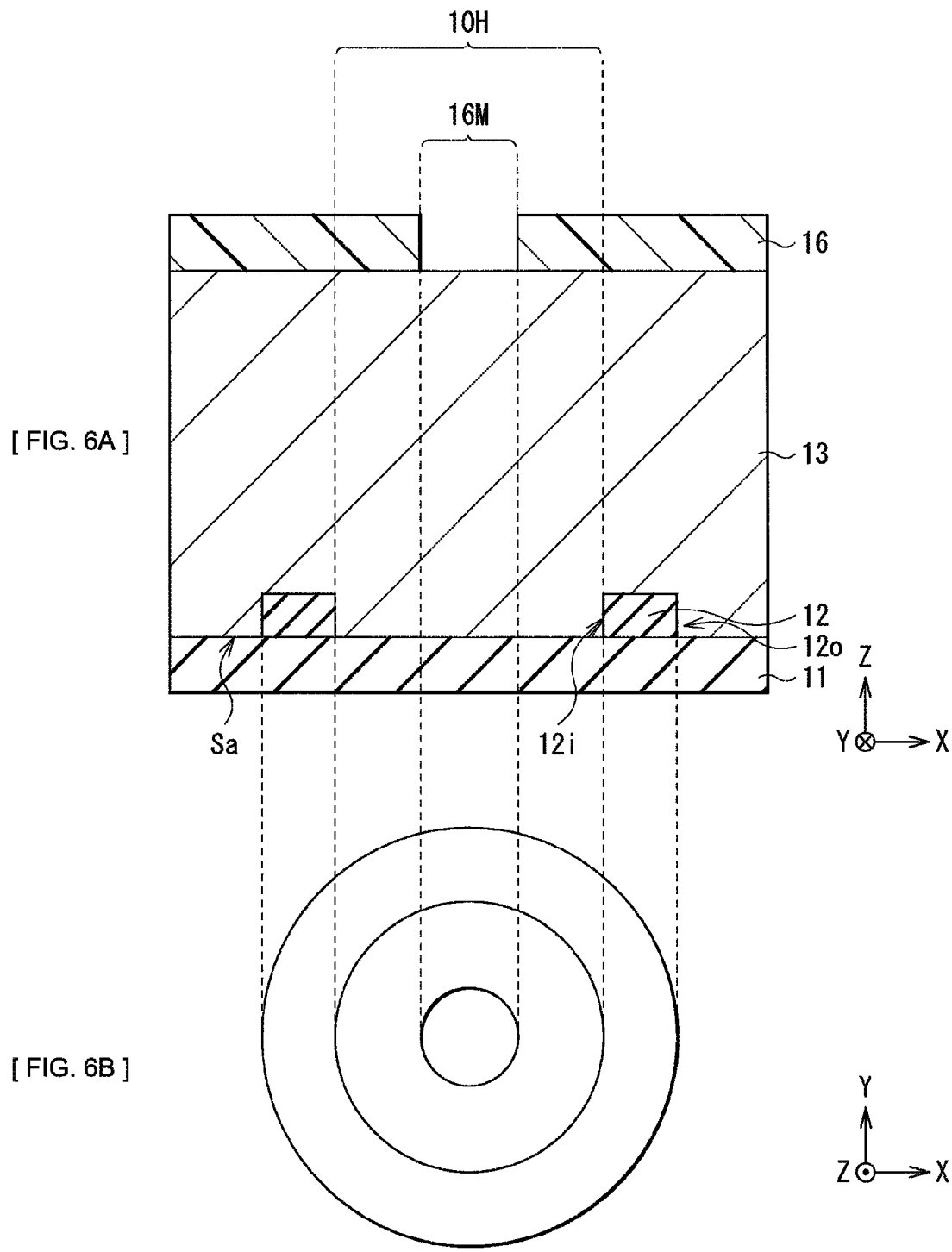

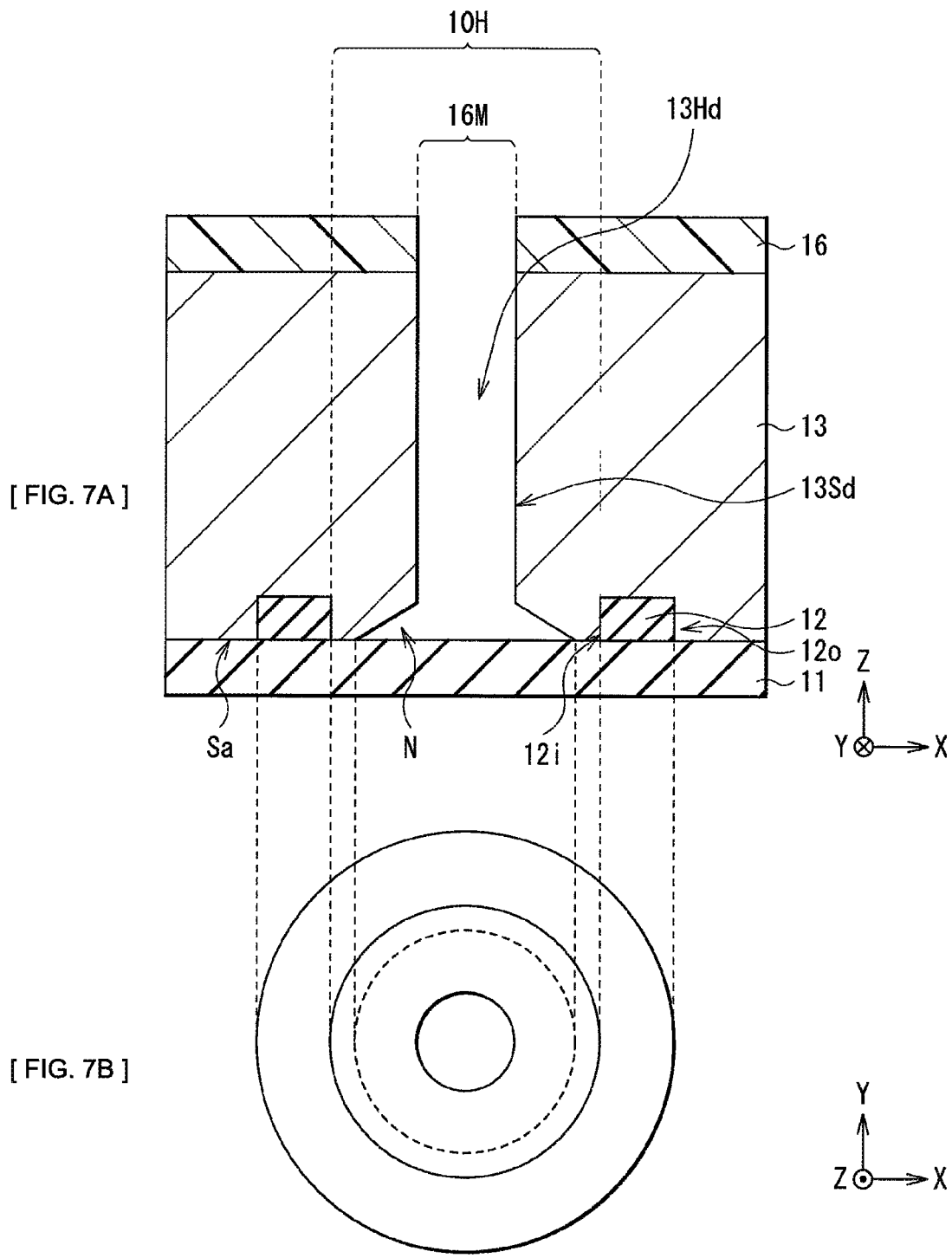

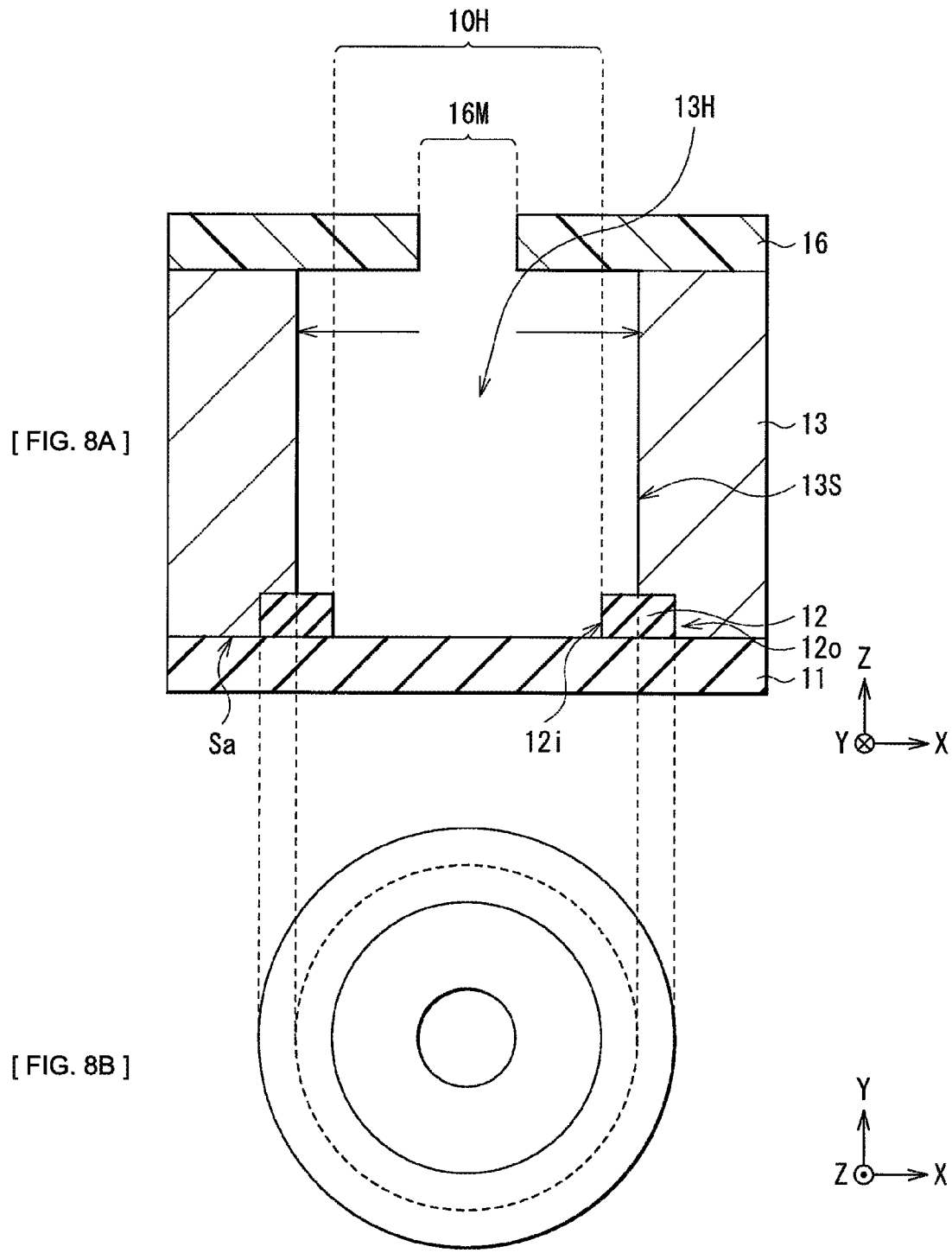

[FIG. 9]
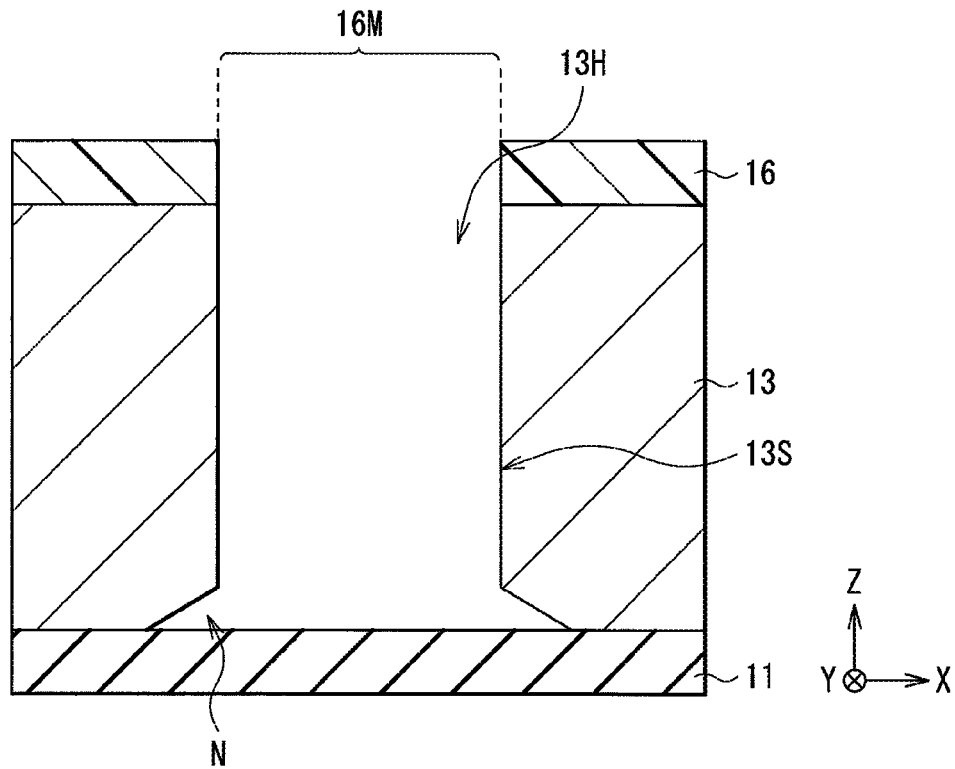
[FIG. 10]
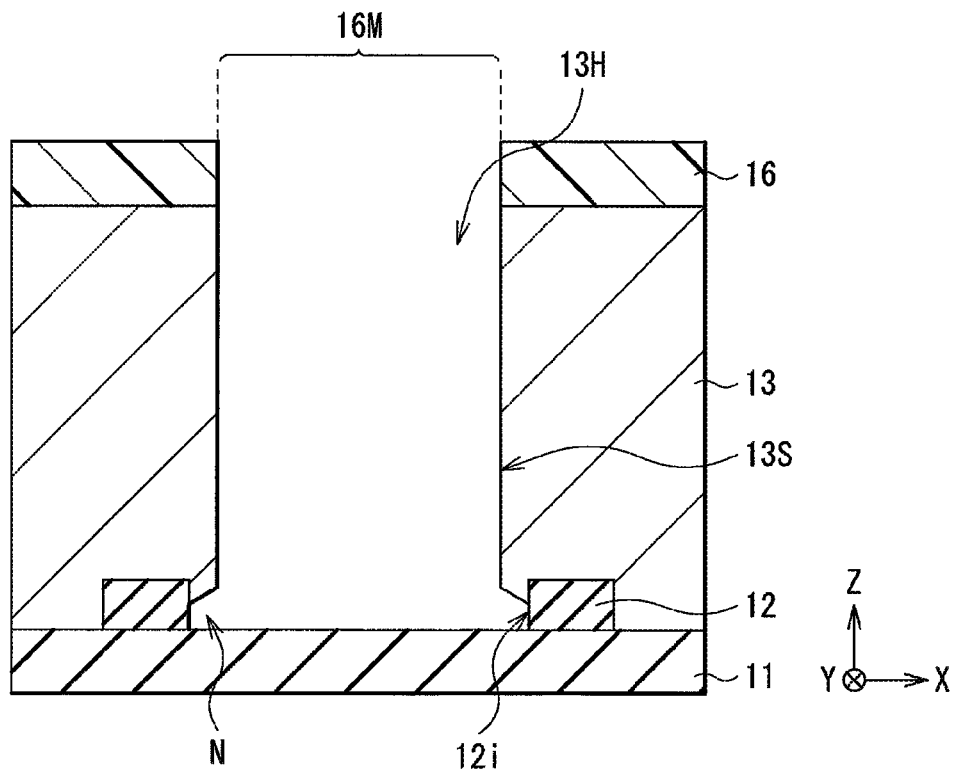

[FIG. 11]
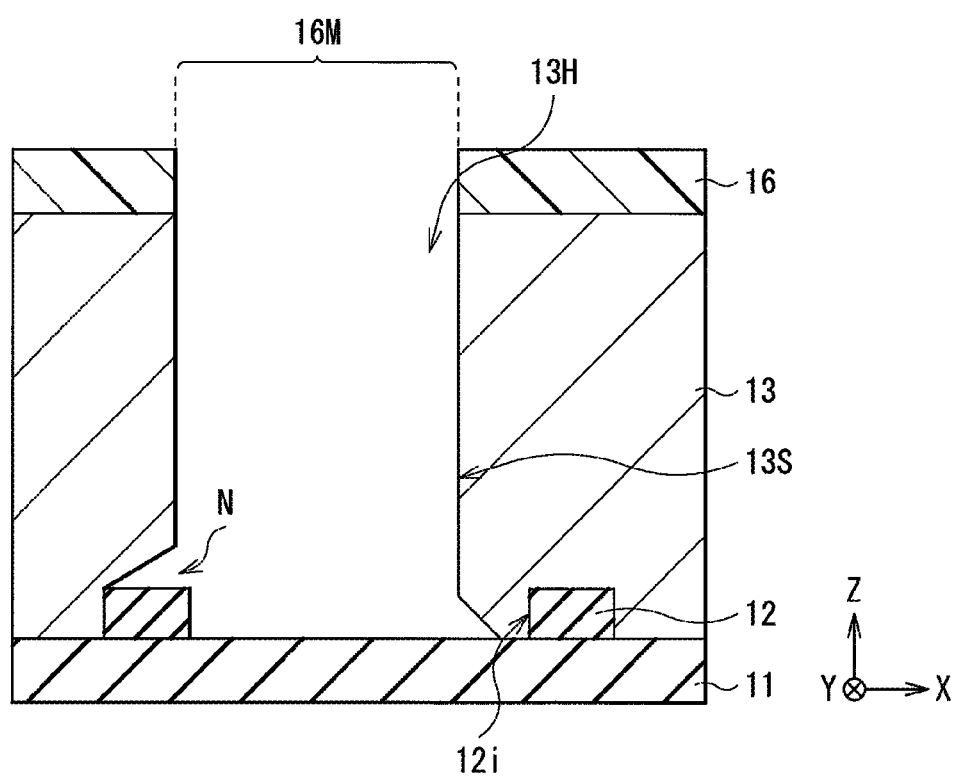

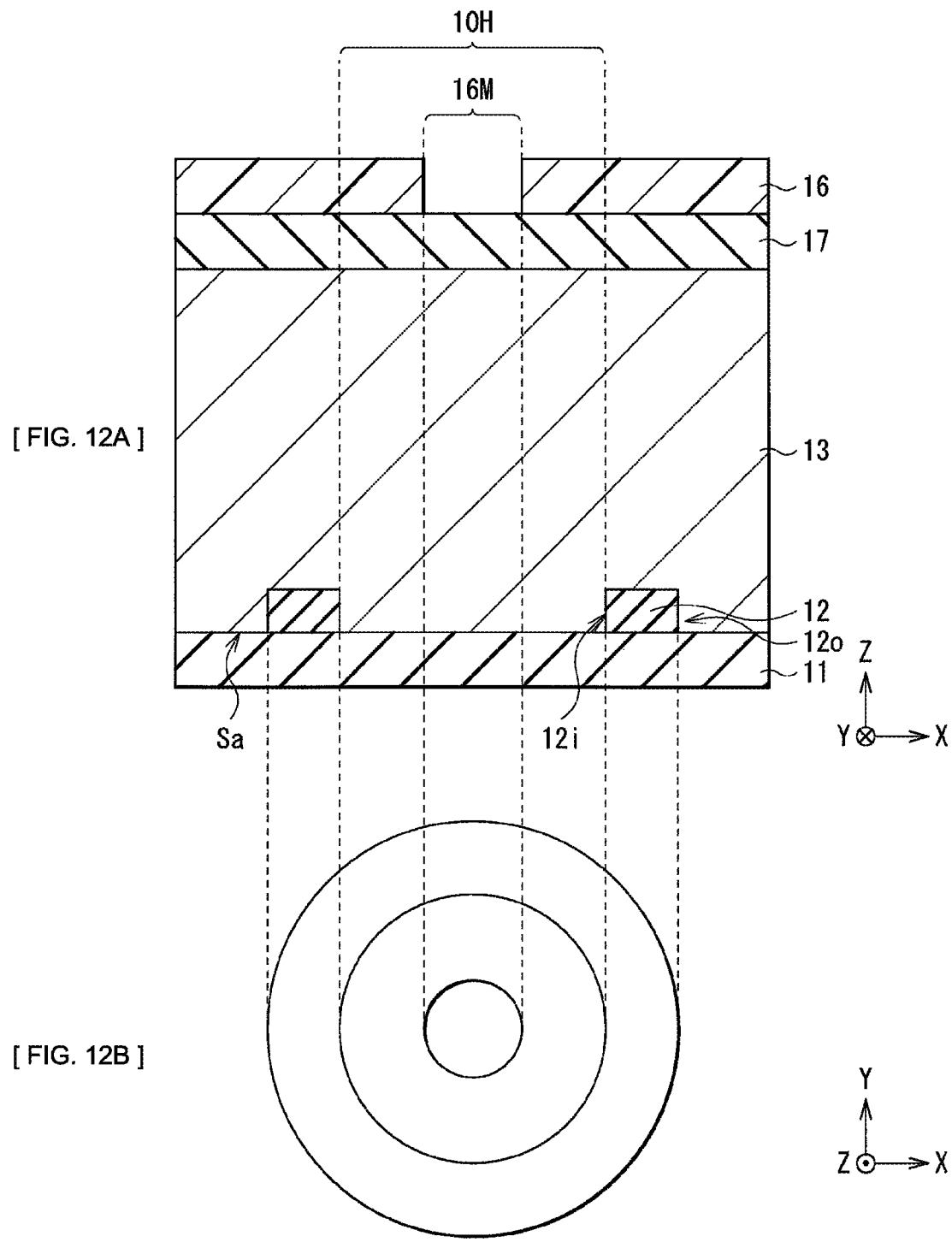

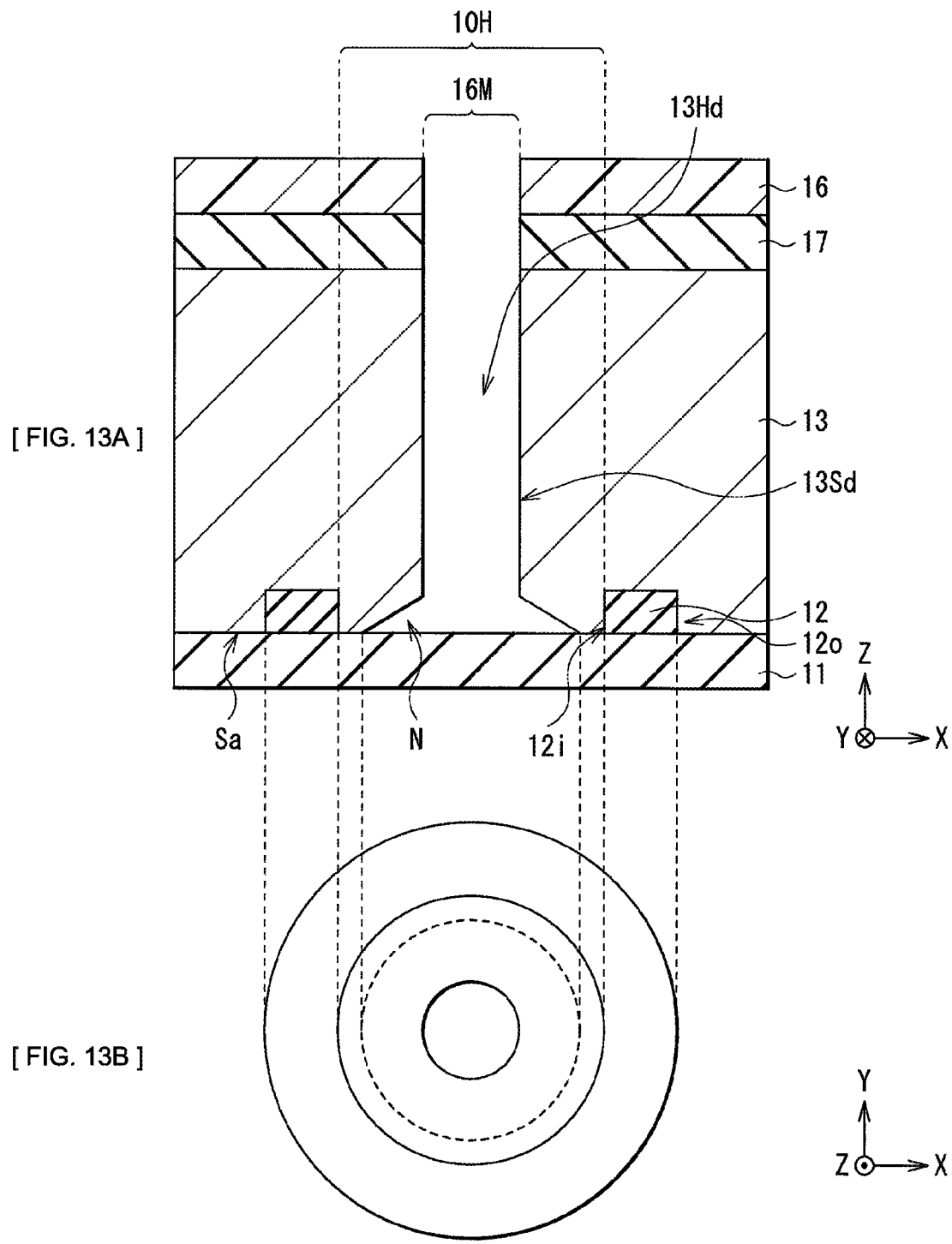

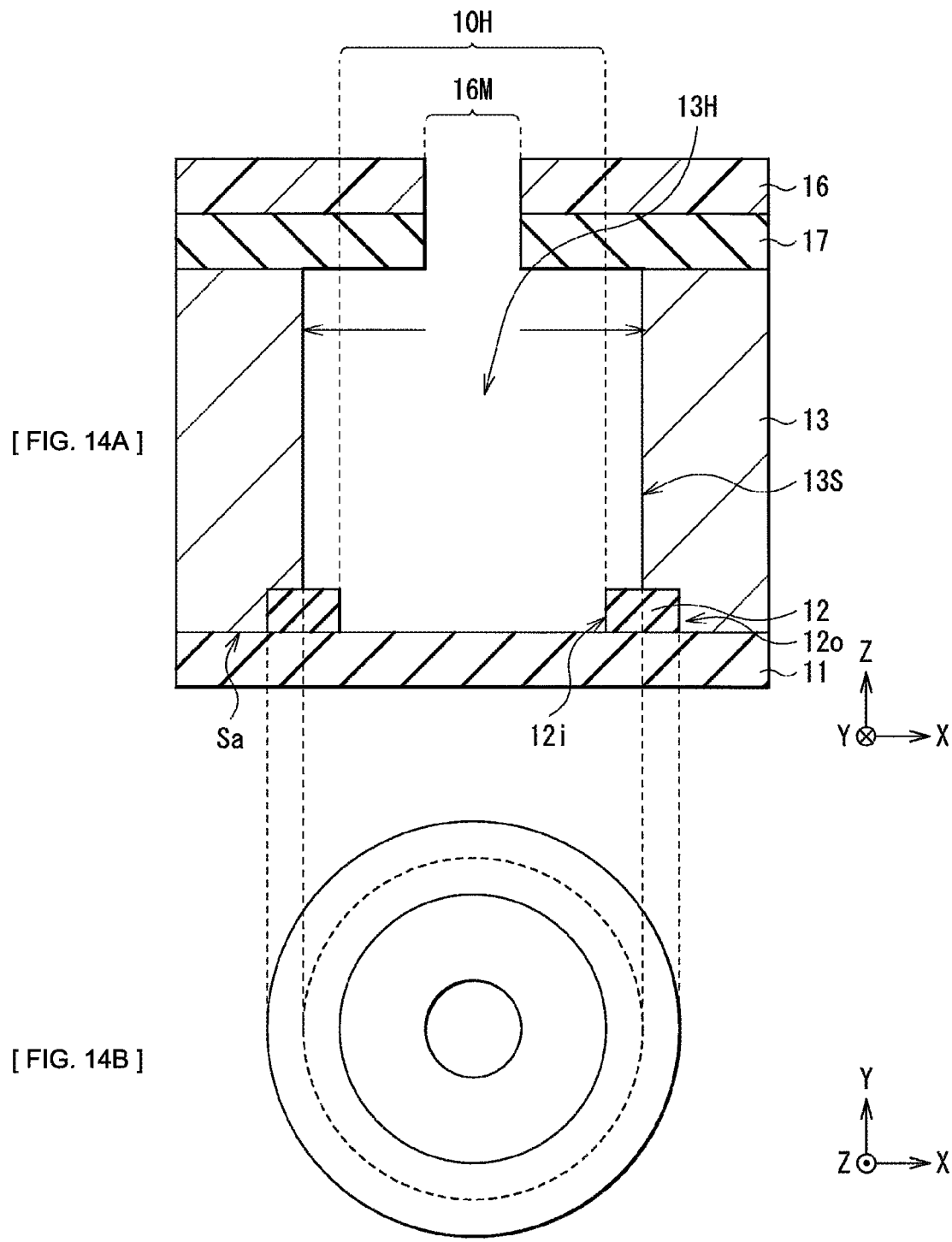

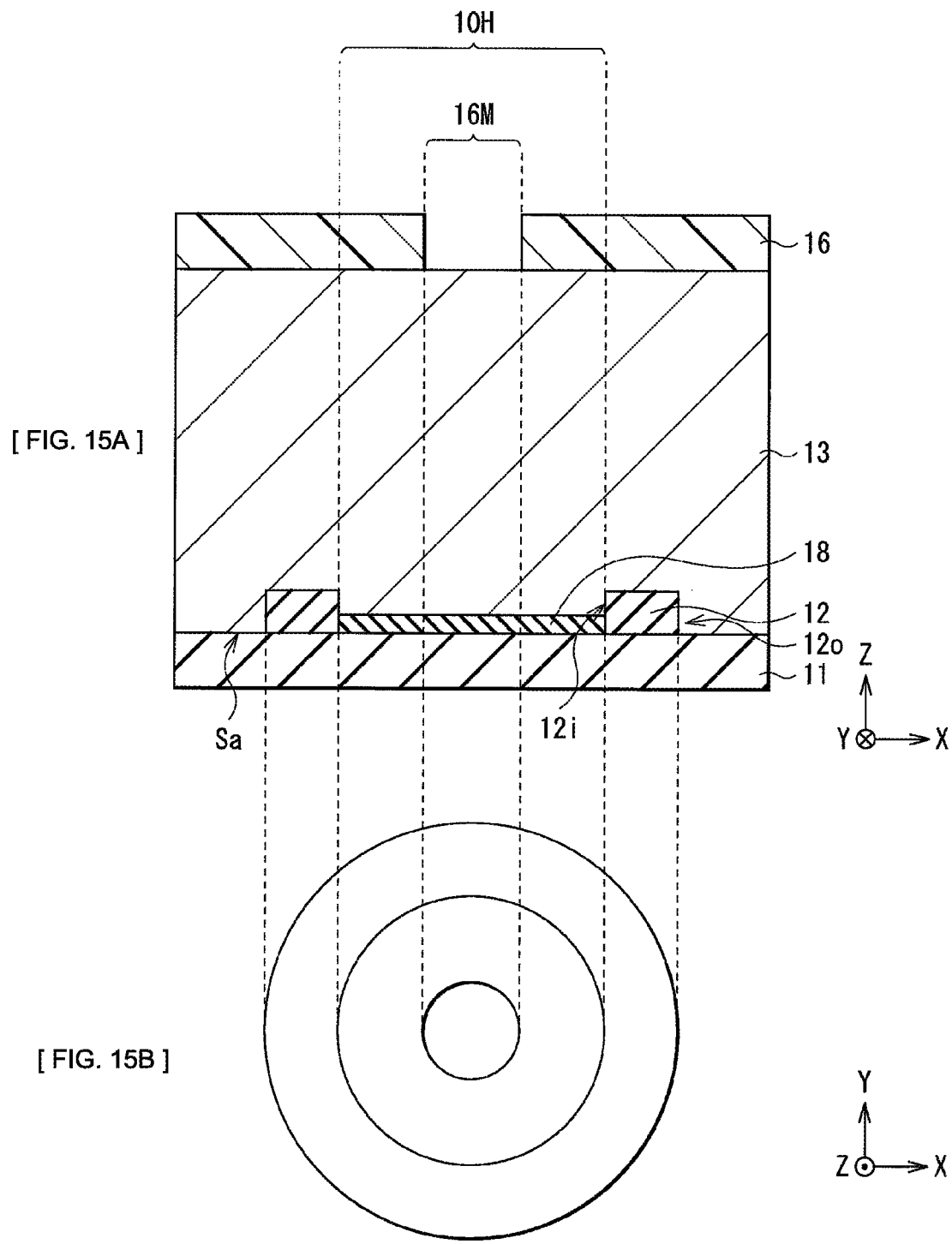

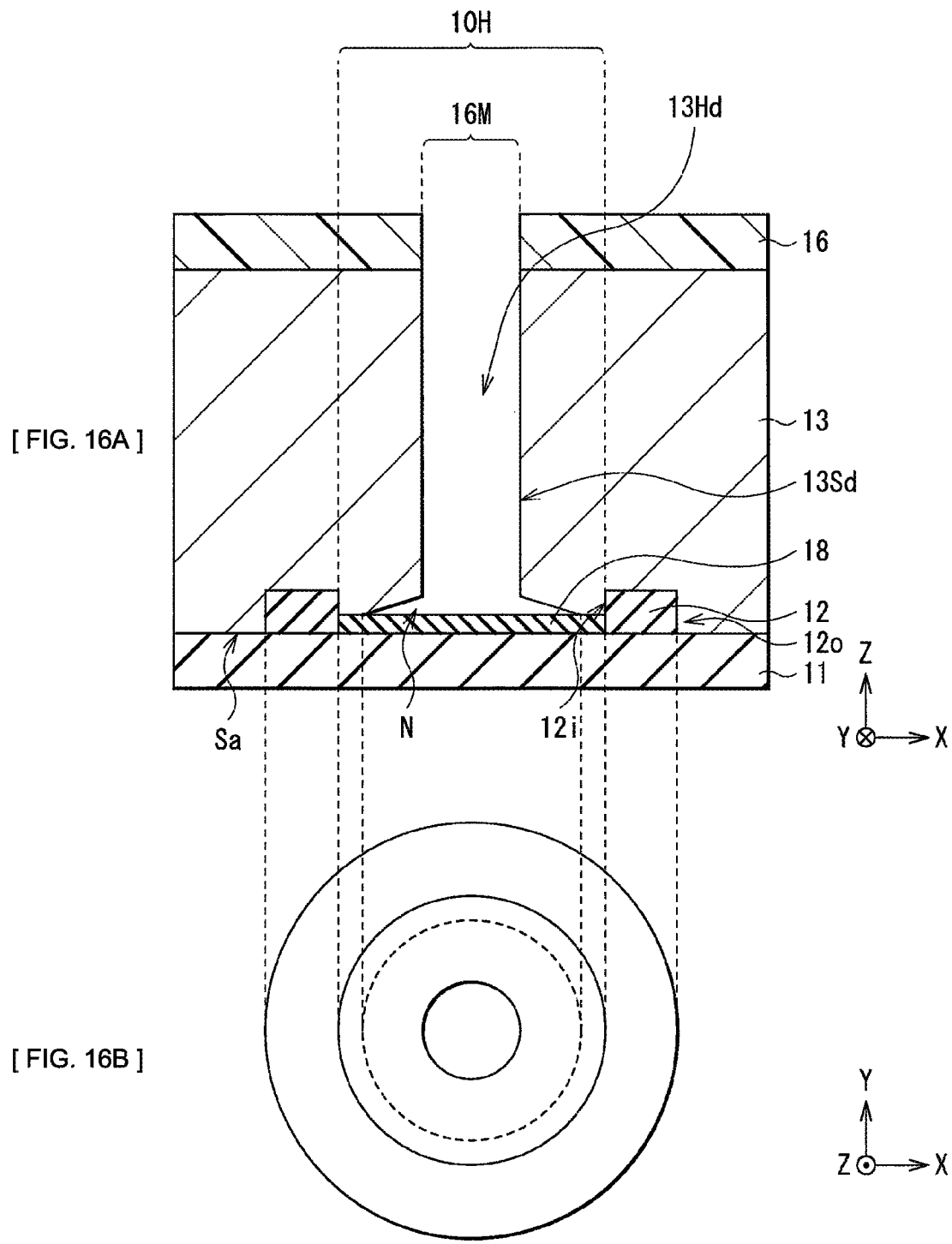

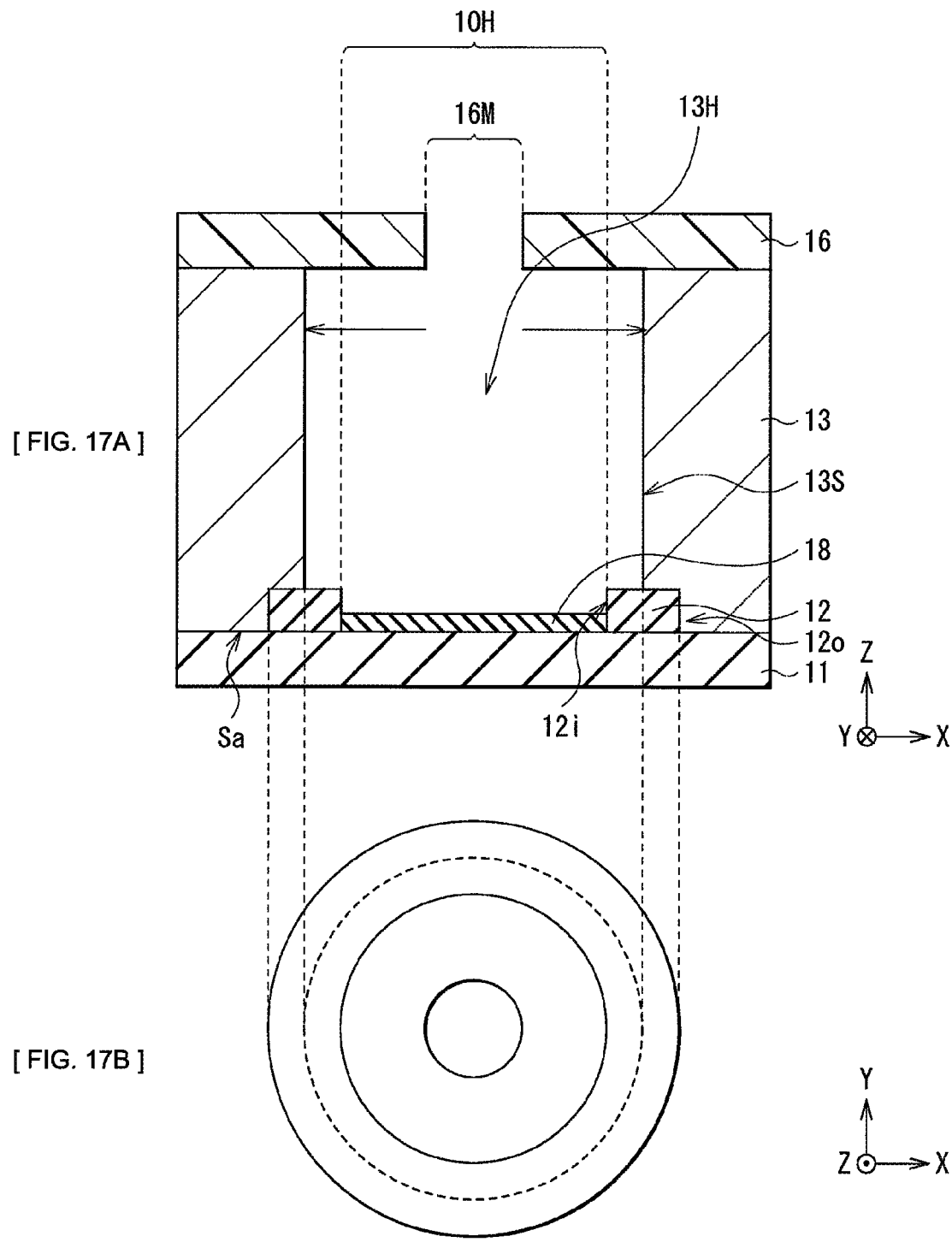
[ FIG. 17A ]
[ FIG. 17B ]

[FIG. 18]
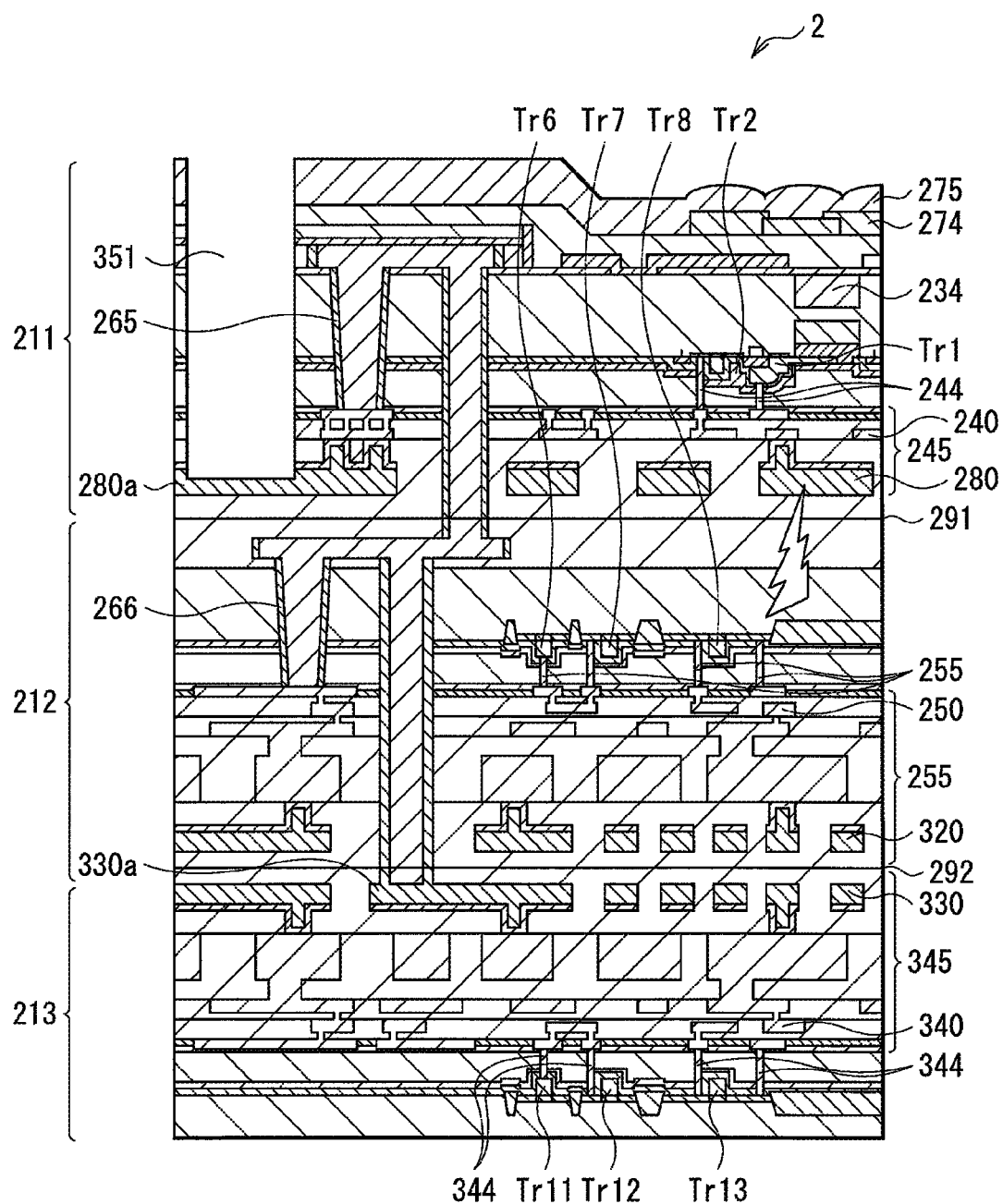

[ FIG. 19 ]
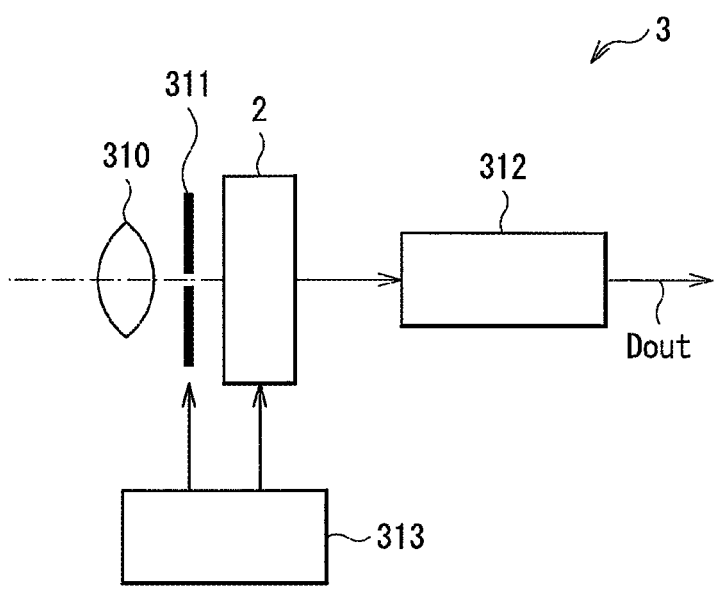

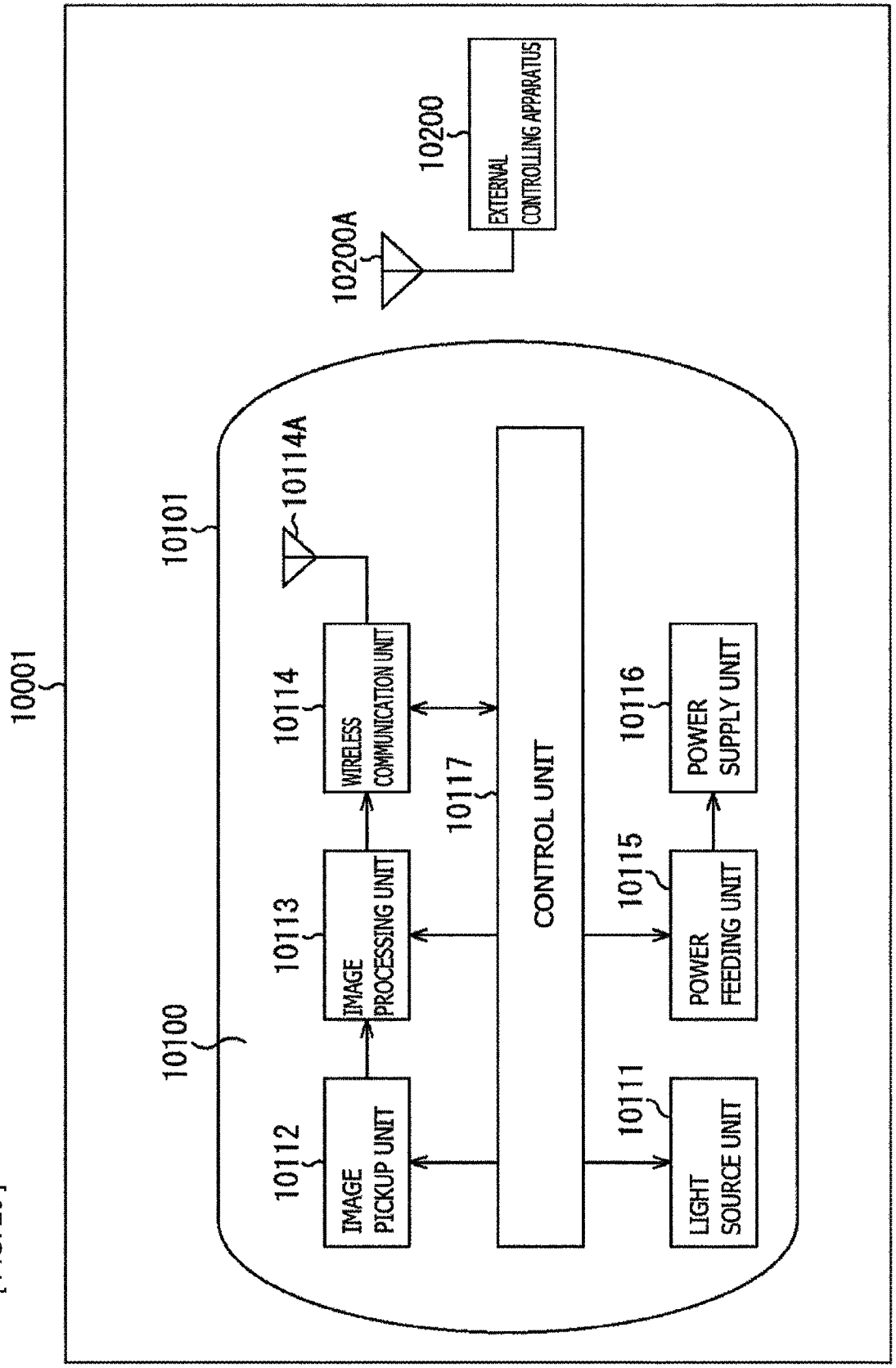
[FIG. 20]

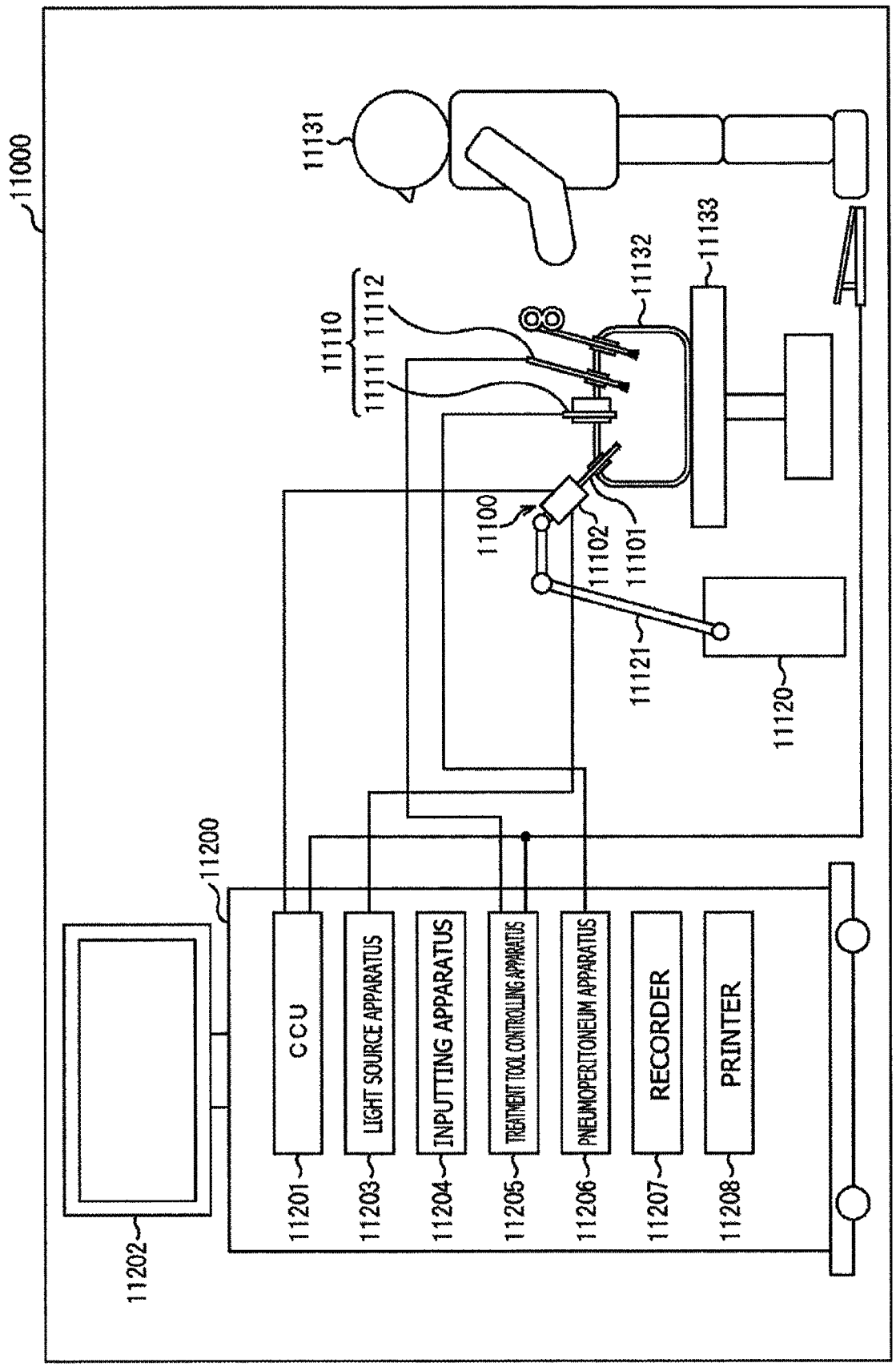
[FIG. 21]

[FIG. 22]
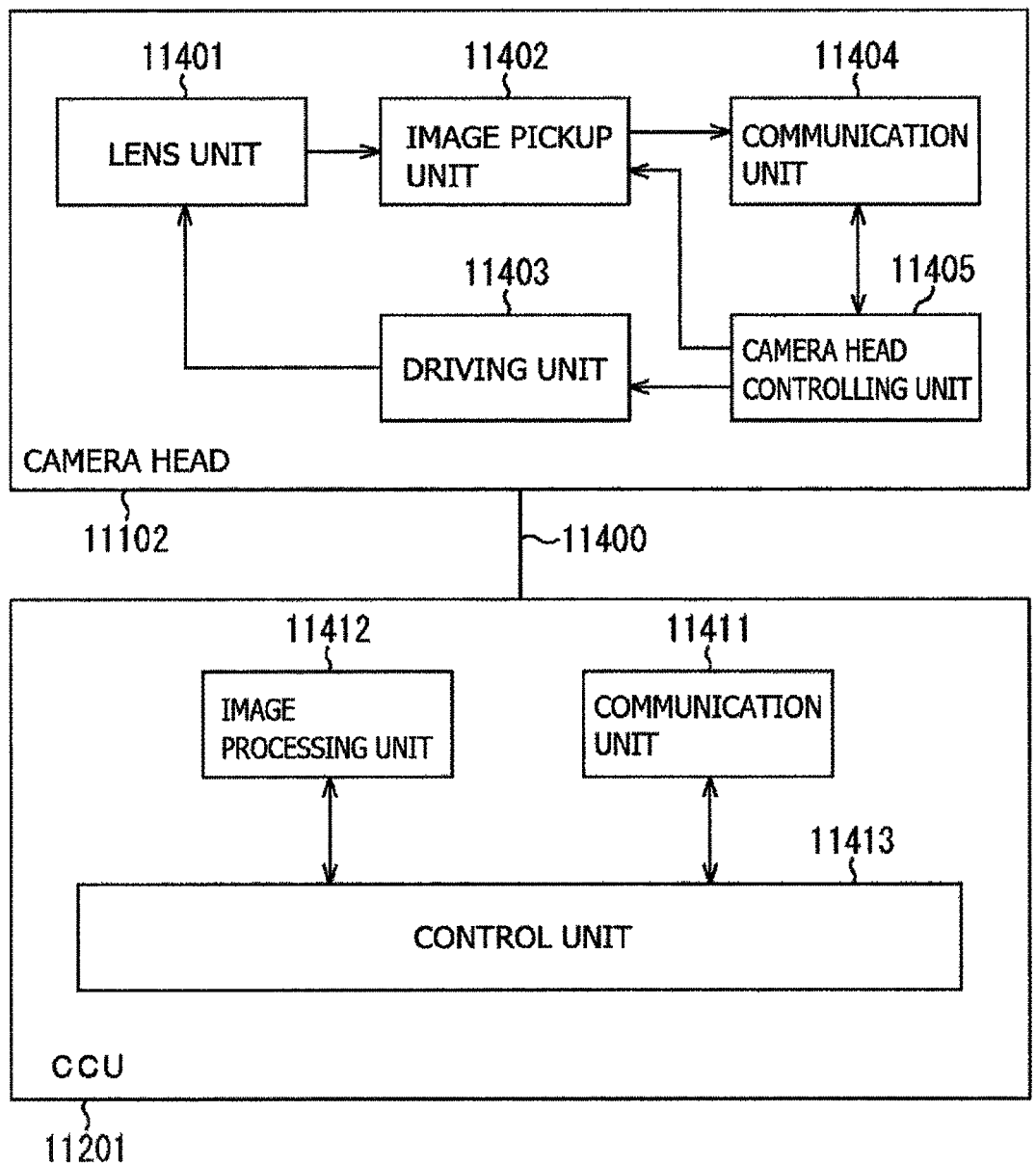

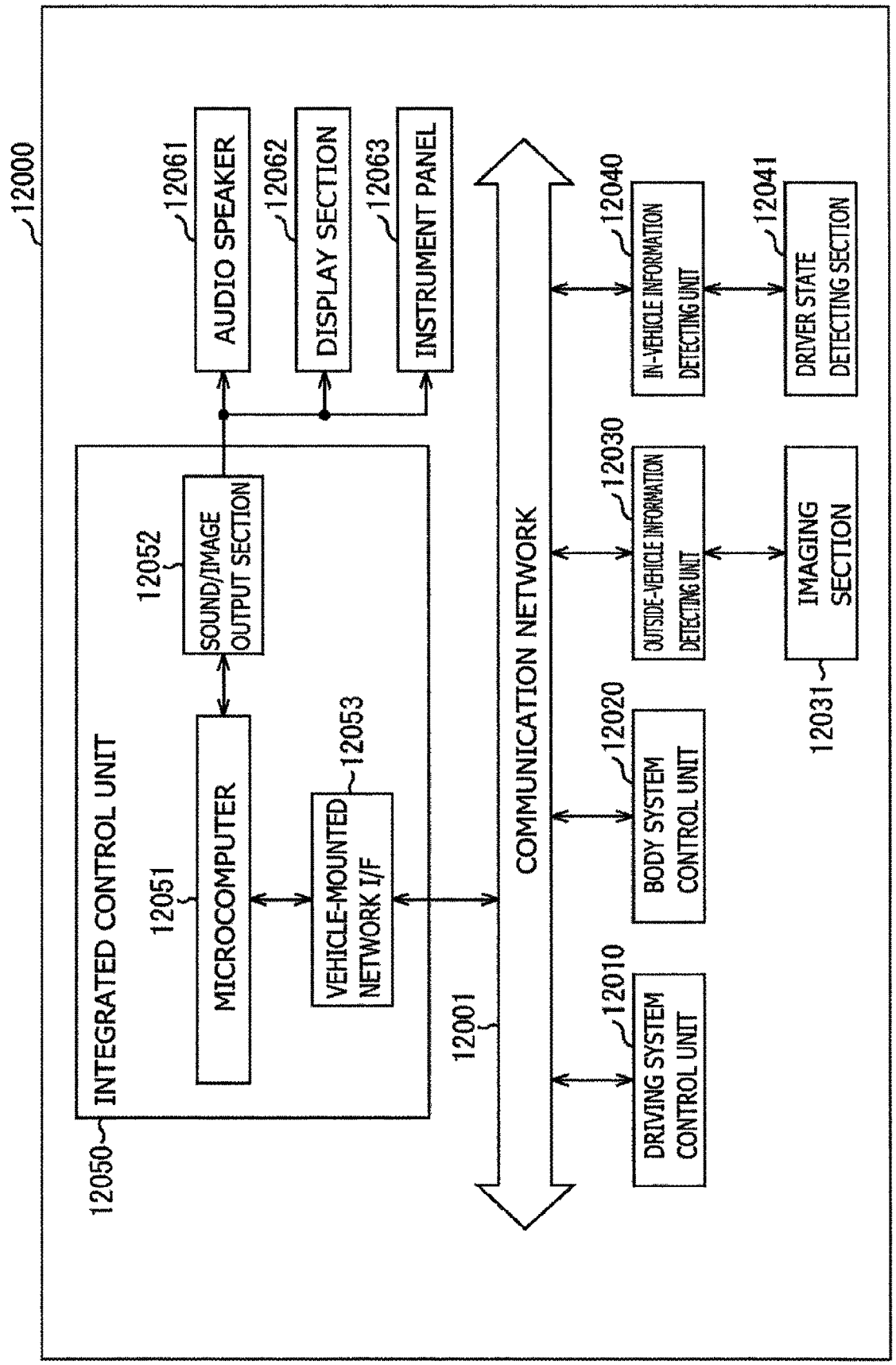
[FIG. 23]

[ FIG. 24 ]
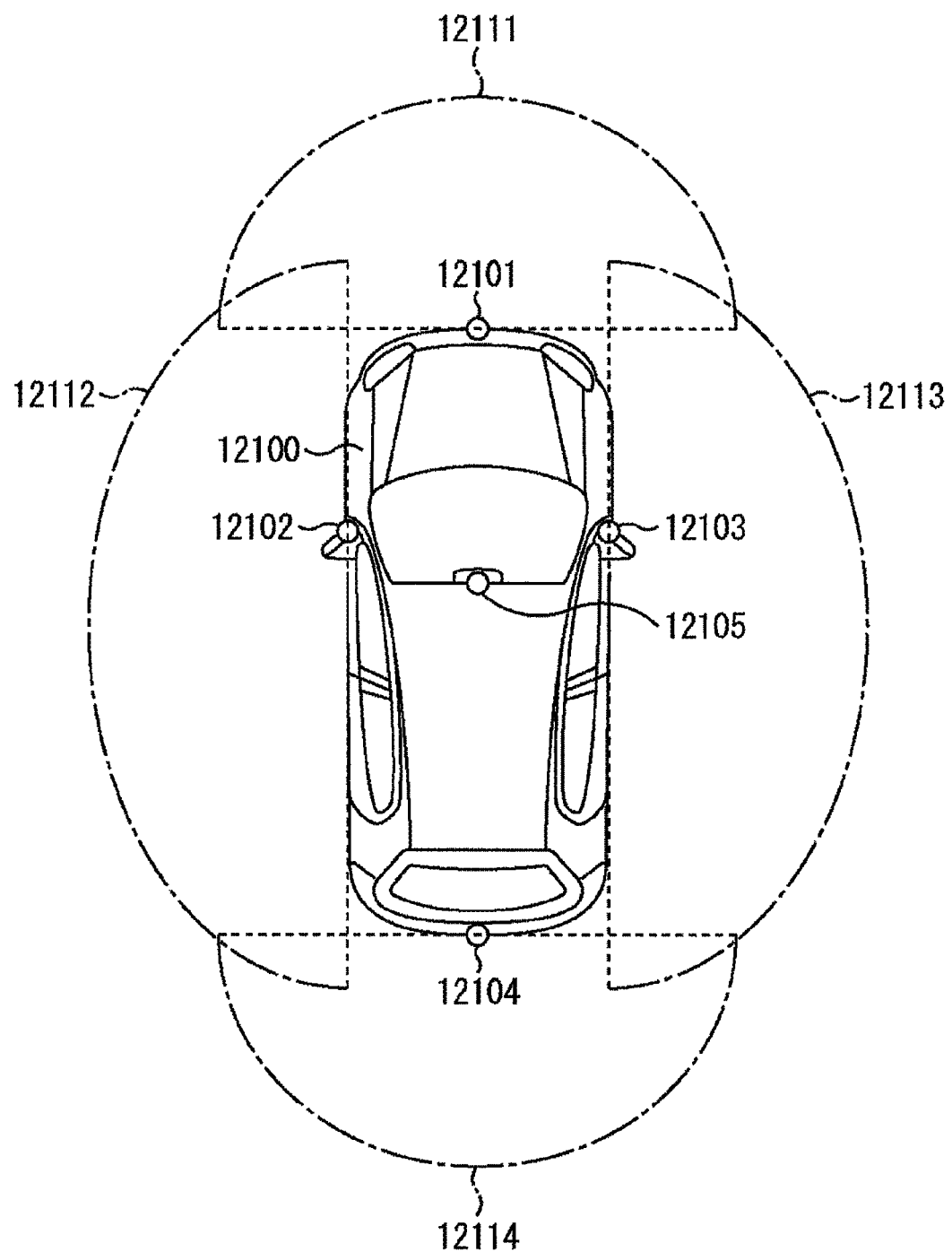

SEMICONDUCTOR DEVICE, MANUFACTURING METHOD FOR SEMICONDUCTOR, AND IMAGING UNIT

CROSS REFERENCE TO RELATED APPLICATIONS

This application is a U.S. National Phase of International Patent Application No. PCT/JP2018/038807 filed on Oct. 18, 2018, which claims priority benefit of Japanese Patent Application No. JP 2017-219120 filed in the Japan Patent Office on Nov. 14, 2017. Each of the above-referenced applications is hereby incorporated herein by reference in its entirety.

TECHNICAL FIELD

The present disclosure relates to a semiconductor device, a manufacturing method for the semiconductor device, and an imaging unit. The semiconductor device has a through electrode structure such as TSV (through silicon via), for example.

BACKGROUND ART

Semiconductor devices each laminated with a plurality of semiconductor chips have been under development. Such a semiconductor device has been expected to achieve high-operating capability with a smaller and thinner, but dense feature, when applied in an imaging unit, for example.

The plurality of semiconductor chips is electrically coupled to each other. This electrical coupling between the semiconductor chips is achieved with a through electrode structure such as TSV (e.g., see PTL 1), for example. In the through electrode structure, an electric conductor is provided in a through hole of a semiconductor substrate via a side wall insulating film, for example.

CITATION LIST

Patent Literature

PTL 1: Japanese Unexamined Patent Application Publication No. 2014-41879

SUMMARY OF THE INVENTION

A semiconductor device having such a through electrode structure has been demanded to suppress the occurrence of a defect due to the through electrode structure.

Therefore, it is desirable to provide such a semiconductor device, a manufacturing method for the semiconductor device, and an imaging unit that make it possible to suppress the occurrence of a defect due to a through electrode structure.

A manufacturing method for a semiconductor device according to an embodiment of the present disclosure includes: forming an insulating wall having an inner peripheral surface surrounding a through hole forming region; and performing anisotropic processing and isotropic processing in this order on a semiconductor substrate to form a through hole whose side wall is provided outwardly from the inner peripheral surface of the insulating wall. The semiconductor substrate has the insulating wall buried in one of surfaces thereof.

In the manufacturing method for the semiconductor device according to the embodiment of the present disclosure, for example, the anisotropic processing is performed to dispose the side wall of the through hole inwardly from the inner peripheral surface of the insulating wall, and the through hole is expanded through the isotropic processing. Even if a notch is created during the anisotropic processing, this causes the insulating wall to correct the shape of the through hole during the isotropic processing.

A semiconductor device according to an embodiment of the present disclosure includes: a through hole forming region; an insulating wall; a semiconductor substrate; a side wall insulating film; and an electric conductor. The insulating wall has an inner peripheral surface surrounding the through hole forming region. The semiconductor substrate has the insulating wall buried in one of surfaces thereof. The semiconductor substrate has a through hole whose side wall is provided outwardly from the inner peripheral surface of the insulating wall. The side wall insulating film covers the side wall of the through hole and the inner peripheral surface of the insulating wall. The electric conductor is provided in the through hole of the semiconductor substrate via the side wall insulating film.

An imaging unit according to an embodiment of the present disclosure includes: a first semiconductor chip and a second semiconductor chip that are laminated; and a through electrode structure that electrically couples the first semiconductor chip and the second semiconductor chip. The through electrode structure includes a through hole forming region, an insulating wall, a semiconductor substrate, a side wall insulating film, and an electric conductor. The insulating wall has an inner peripheral surface surrounding the through hole forming region. The semiconductor substrate has the insulating wall buried in one of surfaces thereof. The semiconductor substrate has a through hole whose side wall is provided outwardly from the inner peripheral surface of the insulating wall. The side wall insulating film covers the side wall of the through hole and the inner peripheral surface of the insulating wall. The electric conductor is provided in the through hole of the semiconductor substrate via the side wall insulating film.

The side wall of the through hole is provided outwardly from the inner peripheral surface of the insulating wall in the semiconductor device and the imaging unit according to the embodiments of the present disclosure, and it is thus possible to manufacture the semiconductor device and the imaging unit in the manufacturing method for the semiconductor device according to the embodiment of the present disclosure described above.

The side wall of the through hole is provided outwardly from the inner peripheral surface of the insulating wall, and the semiconductor device, the manufacturing method for the semiconductor device, and the imaging unit according to the embodiment of the present disclosure make it possible to suppress the occurrence of an electrical defect due to a notch, for example. Therefore, it is possible to suppress the occurrence of a defect due to the through electrode structure.

It is to be noted that the above content is an example of the present disclosure. An effect of the present disclosure is not limited to the effects described above, and may be other different effect or may further include other effects.

BRIEF DESCRIPTION OF DRAWING

FIG. 1 is a schematic cross-sectional view of an outline configuration of a main part of a semiconductor device according to an embodiment of the present disclosure.

FIG. 2A is a schematic diagram illustrating a cross-sectional configuration of a through hole and an insulating wall illustrated in FIG. 1, and FIG. 2B is a schematic diagram illustrating a plan configuration corresponding to FIG. 2A.

FIG. 3A is a schematic diagram illustrating another example of the cross-sectional configuration of the through hole and an insulating wall illustrated in FIGS. 2A and 2B, and FIG. 3B is a schematic diagram illustrating a plan configuration corresponding to FIG. 3A.

FIG. 4 is a cross-sectional schematic diagram illustrating another example (1) of a position of a side wall of the through hole illustrated in FIGS. 2A and 2B.

FIG. 5 is a cross-sectional schematic diagram illustrating another example (2) of the position of the side wall of the through hole illustrated in FIGS. 2A and 2B.

FIG. 6A is a cross-sectional schematic diagram illustrating a step of a manufacturing method for the semiconductor device illustrated in FIG. 1, and FIG. 6B is a plan schematic diagram corresponding to FIG. 6A.

FIG. 7A is a cross-sectional schematic diagram illustrating a step following FIGS. 6A and 6B, and FIG. 7B is a plan schematic diagram corresponding to FIG. 7A.

FIG. 8A is a cross-sectional schematic diagram illustrating a step following FIGS. 7A and 7B, and FIG. 8B is a plan schematic diagram corresponding to FIG. 8A.

FIG. 9 is a cross-sectional schematic diagram for describing a manufacturing method for a semiconductor device according to a comparative example 1.

FIG. 10 is a cross-sectional schematic diagram for describing a manufacturing method for a semiconductor device according to a comparative example 2.

FIG. 11 is a cross-sectional schematic diagram for describing another example of the manufacturing method for the semiconductor device illustrated in FIG. 10.

FIG. 12A is a cross-sectional schematic diagram illustrating a step of a manufacturing method for a semiconductor device according to a modification example 1, and FIG. 12B is a plan schematic diagram corresponding to FIG. 12A.

FIG. 13A is a cross-sectional schematic diagram illustrating a step following FIGS. 12A and 12B, and FIG. 13B is a plan schematic diagram corresponding to FIG. 13A.

FIG. 14A is a cross-sectional schematic diagram illustrating a step following FIGS. 13A and 13B, and FIG. 14B is a plan schematic diagram corresponding to FIG. 14A.

FIG. 15A is a cross-sectional schematic diagram illustrating a step of a manufacturing method for a semiconductor device according to a modification example 2, and FIG. 15B is a plan schematic diagram corresponding to FIG. 15A.

FIG. 16A is a cross-sectional schematic diagram illustrating a step following FIGS. 15A and 15B, and FIG. 16B is a plan schematic diagram corresponding to FIG. 16A.

FIG. 17A is a cross-sectional schematic diagram illustrating a step following FIGS. 16A and 16B, and FIG. 17B is a plan schematic diagram corresponding to FIG. 17A.

FIG. 18 is a cross-sectional schematic diagram illustrating an example of a configuration of an imaging unit to which the semiconductor device illustrated in FIG. 1 is applied.

FIG. 19 is a functional block diagram illustrating an example of an electronic apparatus (camera) including the imaging unit illustrated in FIG. 18.

FIG. 20 is a block diagram depicting an example of a schematic configuration of an in-vivo information acquisition system.

FIG. 21 is a view depicting an example of a schematic configuration of an endoscopic surgery system.

FIG. 22 is a block diagram depicting an example of a functional configuration of a camera head and a camera control unit (CCU).

FIG. 23 is a block diagram depicting an example of schematic configuration of a vehicle control system.

FIG. 24 is a diagram of assistance in explaining an example of installation positions of an outside-vehicle information detecting section and an imaging section.

MODES FOR CARRYING OUT THE INVENTION

In the following, some embodiments of the present disclosure are described in detail with reference to the drawings. It is to be noted that description is given in the following order.
1. Embodiment (Semiconductor Device having Through Electrode Structure)
2. Modification Example 1 (Example of Manufacturing Method with Photoresist and Inorganic Insulating Film Used as Mask)
3. Modification Example 2 (Example of Manufacturing Method with Organic Insulating Film)
4. Application Example 1 (Example of Imaging unit)
5. Application Example 2 (Example of Electronic Apparatus)
6. Applied Example 1 (Example of Application to In-vivo Information Acquisition System)
7. Applied Example 2 (Example of Application to Endoscopic Surgery System)
8. Applied Example 3 (Example of Application to Mobile Body)

Embodiment

FIG. 1 schematically illustrates a cross-sectional configuration of a main part of a semiconductor device (a semiconductor device 1) according to an embodiment of the present disclosure. This semiconductor device 1 is applied to an imaging unit (an imaging unit 2 in FIG. 18 described later) or the like, for example. The semiconductor device 1 includes a first semiconductor chip 10 and a second semiconductor chip 20 laminated to each other. The first semiconductor chip 10 and the second semiconductor chip 20 are in contact with each other via a joining surface S, and are laminated to each other. These first semiconductor chip 10 and second semiconductor chip 20 are electrically coupled to each other via a through electrode structure provided to the first semiconductor chip 10, for example. This through electrode structure is TSV, for example.

The first semiconductor chip 10 includes an insulating layer 11 and a semiconductor substrate 13 in order from the joining surface S side. The semiconductor substrate 13 has a surface (a surface Sa) opposed to the second semiconductor chip 20. The semiconductor substrate 13 has an insulating wall 12 buried therein from the surface Sa. A through hole 13H of the semiconductor substrate 13 is provided in a region including a region (a through hole forming region 10H described later) surrounded by this insulating wall 12. In the through hole 13H, a side wall insulating film 14 and an electric conductor 15 covering a side wall 13S are provided. The second semiconductor chip 20 includes a multi-layered wiring layer 21.

The insulating layer 11 is provided to the surface Sa of the semiconductor substrate 13. The insulating layer 11 includes silicon oxide (SiO), for example. The thickness of the insulating layer 11 ranges from 1 μm to 2 μm, for example. The insulating layer 11 is provided with a contact 11C. This contact 11C is exposed from the insulating layer 11 in at least a portion of a region facing the through hole 13H. The contact 11C is coupled to the electric conductor 15. The contact 11C includes an electrically-conductive material such as copper (Cu), for example.

The insulating wall 12 is provided in a selective region on the insulating layer 11. The insulating wall 12 has a quadrangular cross-sectional (e.g., a ZX cross-section in FIG. 1) shape. This insulating wall 12 may be integrally provided to the insulating layer 11. The insulating wall 12 includes silicon oxide, for example. The constituent material of the insulating wall 12 and the constituent material of the insulating layer 11 may differ from each other. For example, the insulating wall 12 may include silicon nitride (SiN), silicon oxynitride (SiON), silicon carbonitride (SiCN), or the like. The insulating wall 12 may include a plurality of materials. The height (the size in a Z direction in FIG. 1) of the insulating wall 12 is smaller than the thickness of the semiconductor substrate 13. The height of the insulating wall 12 ranges from 1 μm to 2 μm, for example. The insulating wall 12 is provided to surround the through hole forming region 10H. The insulating wall 12 has an inner peripheral surface 12i and an outer peripheral surface 12o opposed to each other. The inner peripheral surface 12i is provided closer to the through hole forming region 10H than the outer peripheral surface 12o. The inner peripheral surface 12i defines the shape of the through hole forming region 10H.

FIGS. 2A and 2B schematically illustrates a configuration of the insulating wall 12 together with a configuration of the through hole 13H of the semiconductor substrate 13. FIG. 2A illustrates a cross-sectional configuration of the insulating wall 12 and the through hole 13H, and FIG. 2B illustrates a plan configuration of the insulating wall 12 and the through hole 13H. The through hole forming region 10H surrounded by the inner peripheral surface 12i of the insulating wall 12 has a circular plan (an XY plan in FIGS. 2A and 2B) shape, for example. The diameter of the circular through hole forming region 10H ranges from 50 μm to 100 μm, for example.

FIGS. 3A and 3B illustrate another configuration of the insulating wall 12 and the through hole 13H. FIG. 3A illustrates a cross-sectional configuration of the insulating wall 12 and the through hole 13H, and FIG. 3B illustrates a plan configuration of the insulating wall 12 and the through hole 13H. The through hole forming region 10H surrounded by the inner peripheral surface 12i of the insulating wall 12 may have a quadrangular plan (an XY plan in FIGS. 2A and 2B) shape such as a square shape, for example.

As described above, the semiconductor substrate 13 has the through hole 13H in the region including this through hole forming region 10H. A plan shape of the through hole 13H is substantially similar to the plan shape of the through hole forming region 10H, for example. The plan shape of the through hole 13H may be a circular shape (FIG. 2B) or a quadrangular shape such as a square shape (FIG. 3B). In the present embodiment, the through hole 13H is provided over the region wider than the through hole forming region 10H. The side wall 13S of the through hole 13H is disposed outwardly (the outer peripheral surface 12o side) from the inner peripheral surface 12i of the insulating wall 12 (FIGS. 1, 2A, 2B, 3A, and 3B). The through hole 13H like this is manufactured through a method described later, for example. There is thus no abnormality in shape such as notch (a notch N in FIG. 9 described later). The entire side wall 13S of the through hole 13H is disposed vertically to the surface Sa. The side wall 13S of the through hole 13H is disposed at a position opposed to the insulating wall 12 (between the inner peripheral surface 12i and the outer peripheral surface 12o), for example.

As illustrated in FIGS. 4 and 5, the side wall 13S of the through hole 13H may be disposed outwardly from the outer peripheral surface 12o of the insulating wall 12, i.e., outwardly from the insulating wall 12. A portion of the side wall 13S of the through hole 13H may be disposed outwardly from the insulating wall 12 (FIG. 4). The entire side wall 13S in the through hole 13H may be disposed outwardly from the insulating wall 12 (FIG. 5).

The semiconductor substrate 13 includes a silicon (Si) substrate, for example. At this time, for example, the through hole 13H extending in a crystal plane orientation may be provided on a (100) surface of the semiconductor substrate 13. The plan shape of this through hole 13H extending in the crystal plane orientation is a square shape (FIG. 3B). The semiconductor substrate 13 may include silicon carbide (SiC). The thickness of the semiconductor substrate 13 ranges from 50 μm to 100 μm, for example.

The side wall 13S of the through hole 13H is covered by the side wall insulating film 14. In the semiconductor device 1, as described above, there is no abnormality in shape such as notch in the through hole 13H. The entire side wall 13S is thus covered by the side wall insulating film 14, suppressing the occurrence of a short circuit between the electric conductor 15 and the side wall 13S. This side wall insulating film 14 covers the inner peripheral surface 12i of the insulating wall 12 together with the side wall 13S of the through hole 13H. In other words, an interface between the insulating wall 12 (the inner peripheral surface 12i) and the side wall insulating film 14 is present in the through hole 13H. The side wall insulating film 14 includes an inorganic insulating material such as silicon oxide, silicon nitride, silicon oxynitride, and silicon carbonitride, for example. The side wall insulating film 14 may have a layered structure.

The electric conductor 15 is buried in the through hole 13H whose side wall 13S is covered by the side wall insulating film 14. That is, the side wall insulating film 14 is provided between the side wall 13S and the electric conductor 15. A barrier metal film (not illustrated) may be provided between the side wall insulating film 14 and the electric conductor 15. The barrier metal film includes titanium (Ti), titanium nitride (TiN), or tantalum (Ta), for example. The electric conductor 15 is in contact with the contact 11C exposed from the insulating layer 11. The electric conductor 15 includes copper (Cu), for example. The electric conductor 15 may include tungsten (W), nickel (Ni), aluminum (Al), polysilicon, or the like, for example.

The multi-layered wiring layer 21 of the second semiconductor chip 20 includes a contact 21C, a wiring line 21W, and a pad 21P, for example. The contact 21C is in contact, via the joining surface S, with the contact 11C of the first semiconductor chip 10. The contact 21C includes an electrically-conductive material similar to the electrically-conductive material of the contact 11C described above. The pad 21P is disposed at a position farther from the first semiconductor chip 10 than the contact 21C. The pad 21P includes aluminum (Al), for example. The wiring line 21W electrically couples the contact 21C and the pad 21P. As described above, the electric conductor 15 of the first semiconductor chip 10 is electrically coupled to the pad 21P via the contacts 11C and 21C and the wiring line 21W.

The semiconductor device 1 like this is manufactured as described below, for example (FIGS. 6A, 6B, 7A, 7B, 8A, and 8B). FIGS. 6A, 7A, and 8A illustrate cross-sectional configurations in respective steps. FIGS. 6B, 7B, and 8B respectively illustrate plan configurations in the steps corresponding to FIGS. 6A, 7A, and 8A.

The semiconductor substrate 13 is first prepared. Next, a groove surrounding the circular through hole forming region 10H with a diameter of 70 µm, for example, is formed on one (the surface Sa) of the surfaces of this semiconductor substrate 13. After that, silicon oxide, for example, is buried in the groove. This forms the insulating wall 12. The insulating layer 11 is formed on the surface Sa of the semiconductor substrate 13. The insulating layer 11 may be formed, together with the insulating wall 12, through a single step. Alternatively, the insulating layer 11 may be formed after the insulating wall 12 is formed.

After the insulating layer 11 and the insulating wall 12 are formed, a photoresist 16 having an opening 16M is formed on the other surface of the semiconductor substrate 13, as illustrated in FIGS. 6A and 6B. The opening 16M is provided at a position opposed to the through hole forming region 10H. The opening 16M has a circular plan shape, for example. The opening 16M is concentric with the through hole forming region 10H, for example. The diameter of the opening 16M is smaller than the diameter of the through hole forming region 10H. The diameter of the opening 16M is 60 µm, for example. The thickness of the photoresist 16 is 1 µm, for example.

After the photoresist 16 is formed, the photoresist 16 is used as a mask to perform anisotropic processing on the semiconductor substrate 13, as illustrated in FIGS. 7A and 7B. As the anisotropic processing, dry-etching such as reactive ion etching (RIE: Reactive Ion Etching) is used, for example. During this anisotropic processing, a through hole (a through hole 13Hd) is formed on the semiconductor substrate 13. The through hole (the through hole 13Hd) is formed in a region that is substantially identical in size to the opening 16M of the photoresist 16, i.e., that is smaller than the through hole forming region 10H. A side wall (a side wall 13Sd) of this through hole 13Hd is disposed inwardly from the inner peripheral surface 12i of the insulating wall 12. When the through hole 13Hd is formed through the anisotropic processing, a notch (the notch N) is formed around the surface Sa, for example. The notch N is an abnormal portion in shape created as the etching advances in a direction (an X direction in FIG. 7A) vertical to an etching direction (a Z direction in FIG. 7A). The size of the notch N is approximately 3 µm, for example. Around the surface Sa, the diameter of the through hole 13Hd expands to approximately 66 µm. The notch N is also disposed inwardly from the inner peripheral surface 12i of the insulating wall 12.

After the anisotropic processing is performed on the semiconductor substrate 13, isotropic processing is performed on the semiconductor substrate 13. Therefore, as illustrated in FIGS. 8 and 8B, the through hole 13Hd is expanded to form the through hole 13H. As the isotropic processing, dry-etching such as chemical dry etching (CDE: Chemical Dry Etching) is used, for example. During this isotropic processing, etching is performed to a depth of 7 µm, by taking into account an alignment shift of approximately ±3 µm, for example. This forms the through hole 13H whose side wall 13S is disposed outwardly from the inner peripheral surface 12i of the insulating wall 12. Additionally, when the through hole 13Hd expands, the notch N (FIG. 7A) comes into contact with the insulating wall 12, and disappears. That is, the isotropic processing corrects the shape of the through hole 13Hd to form the through hole 13H without the notch N.

After the through hole 13H is formed on the semiconductor substrate 13, CVD (Chemical Vapor Deposition) is used, for example, to form the side wall insulating film 14 on the side wall 13S of this through hole 13H and the inner peripheral surface 12i of the insulating wall 12. Next, after the contact 11C of the insulating layer 11 is exposed through etching, for example, the electric conductor 15 is formed in the through hole 13H. The electric conductor 15 is formed by using electrolytic plating or plasma CVD, for example. After that, CMP (Chemical Mechanical Polishing) is used, for example, to remove the electric conductor 15 outside the through hole 13H. As described above, the semiconductor device 1 is formed.

In the semiconductor device 1, the electric conductor 15 provided in the through hole 13H of the semiconductor substrate 13 is electrically coupled to the pad 21P via the contacts 11C and 21C and the wiring line 21W. That is, the first semiconductor chip 10 including the semiconductor substrate 13 and the second semiconductor chip 20 including the pad 21P are electrically coupled via the through electrode structure.

It is possible to manufacture the semiconductor device 1 according to the present embodiment through the method described above. Specifically, anisotropic processing is performed to allow the side wall 13Sd of the through hole 13Hd to be disposed inwardly from the inner peripheral surface 12i of the insulating wall 12 (FIGS. 7A and 7B). Isotropic processing is then performed to expand this through hole 13Hd. Therefore, the side wall 13S of the through hole 13H is disposed outwardly from the inner peripheral surface 12i of the insulating wall 12. Even if the notch N is created during anisotropic processing, this causes the insulating wall 12 to correct the shape of the through hole 13Hd during isotropic processing. The following describes the workings and effects thereof.

FIG. 9 illustrates a step of a manufacturing method for a semiconductor device according to a comparative example 1. In this method, etching is performed on the semiconductor substrate 13 to form the through hole 13H without forming an insulating wall (the insulating wall 12 in FIG. 1 and other diagrams). Since variation in thickness of the semiconductor substrate 13 is taken into account, the etching is performed excessively with respect to the thickness of the semiconductor substrate 13. Here, variation in thickness of the semiconductor substrate 13 includes variation in thickness per the semiconductor substrate 13 between a plurality of the semiconductor substrates 13, and variation in thickness of each of the semiconductor substrates 13. Therefore, the notch N is formed around the insulating layer 11. Around the portion of the notch N, it is not possible to fully cover the side wall 13S with a side wall insulating film, easily leading to an electrical defect such as short circuit between the side wall 13S and an electric conductor.

FIG. 10 illustrates a step of a manufacturing method for a semiconductor device according to a comparative example 2. As described above, even if the notch N is created, providing the insulating wall 12 allows the insulating wall 12 to secure insulating properties between the side wall 13S and an electric conductor as long as the notch N is in contact with the inner peripheral surface 12i of the insulating wall 12.

However, as illustrated in FIG. 11, a positional shift may occur between the through hole 13H and the insulating wall 12. In a case where the notch N is disposed outwardly from the inner peripheral surface 12i of the insulating wall 12, or in a case where the notch N is disposed inwardly from the inner peripheral surface 12i, but the notch N is not in contact with the inner peripheral surface 12i, a short circuit occurs between the side wall 13S and the electric conductor due to the notch N.

In contrast, in the present embodiment, as described above, anisotropic processing and isotropic processing are performed in this order on the semiconductor substrate 13 to form the through hole 13H whose side wall 13S is disposed outwardly from the inner peripheral surface 12i of the insulating wall 12. Therefore, the insulating wall 12 causes the notch N to disappear during isotropic processing, suppressing the creation of the notch N on the through hole 13H.

As described above, in the semiconductor device 1 according to the present embodiment, the side wall 13S of the through hole 13H is provided outwardly from the inner peripheral surface 12i of the insulating wall 12, and it is thus possible to suppress the occurrence of an electrical defect due to the notch N or the like, for example. Therefore, it is possible to suppress the occurrence of a defect due to the through electrode structure.

While modification examples of the above-described embodiment are described below, the same components as those of the above-described embodiment are denoted with the same reference numerals in the following description, and descriptions thereof are omitted as appropriate.

Modification Example 1

FIGS. 12A, 12B, 13A, 13B, 14A, and 14B each illustrate a manufacturing method for the semiconductor device 1 according to a modification example 1. FIGS. 12A, 13A, and 14A illustrate cross-sectional configurations in respective steps. FIGS. 12B, 13B, and 14B respectively illustrate plan configurations in the steps corresponding to FIGS. 12A, 13A, and 14A. As described above, an inorganic insulating film (an inorganic insulating film 17) may be used together with the photoresist 16 as a mask to perform anisotropic processing on the semiconductor substrate 13.

After the insulating layer 11 and the insulating wall 12 are formed on one (the surface Sa) of the surfaces of the semiconductor substrate 13 similarly to the present embodiment described above, the inorganic insulating film 17 and the photoresist 16 are formed in this order on the other surface of the semiconductor substrate 13. Silicon oxide having a thickness of 1 µm to 5 µm, for example, is used to form the inorganic insulating film 17. After that, the opening 16M is formed on the photoresist 16 (FIGS. 12A and 12B).

Next, this photoresist 16 is used as a mask to perform anisotropic processing in the order of the inorganic insulating film 17 and the semiconductor substrate 13 (FIGS. 13A and 13B). Therefore, the semiconductor substrate 13 is etched with the photoresist 16 and the inorganic insulating film 17 used as the mask.

After that, isotropic processing is performed on the semiconductor substrate 13 to form the through hole 13H (FIGS. 14A and 14B).

Like the present modification example, the inorganic insulating film 17 may be used together with the photoresist 16 as a mask to perform anisotropic processing on the semiconductor substrate 13. In this case, it is also possible to obtain the equivalent effect to that of the above-described embodiment. Additionally, the use of the inorganic insulating film 17 as a mask makes it possible to increase a mask selection ratio for forming the through hole 13H.

Modification Example 2

FIGS. 15A, 15B, 16A, 16B, 17A, and 17B each illustrate a manufacturing method for the semiconductor device 1 according to a modification example 2. FIGS. 15A, 16A, and 17A illustrate cross-sectional configurations in respective steps. FIGS. 15B, 16B, and 17B respectively illustrate plan configurations in the steps corresponding to FIGS. 15A, 16A, and 17A. As described above, the through hole forming region 10H may be provided with an organic insulating film (an organic insulating film 18).

The organic insulating film 18 is first formed together with the insulating layer 11 and the insulating wall 12 on one (the surface Sa) of the surfaces of the semiconductor substrate 13. The organic insulating film 18 is provided between the insulating layer 11 and the semiconductor substrate 13 in the through hole forming region 10H. The organic insulating film 18 includes amorphous carbon having a thickness of 200 nm to 300 nm, for example.

Next, as described in the present embodiment described above, the photoresist 16 having the opening 16M is formed on the other surface of the semiconductor substrate 13 (FIGS. 15A and 15B). Next, this photoresist 16 is used as a mask to perform anisotropic processing on the semiconductor substrate 13 (FIGS. 16A and 16B). After that, isotropic processing is performed on the semiconductor substrate 13 to form the through hole 13H (FIGS. 17A and 17B). The organic insulating film 18 is removed together with the photoresist 16, for example.

Like the present modification example, the through hole 13H may be formed after the organic insulating film 18 is formed in the through hole forming region 10H. In this case, it is also possible to obtain the equivalent effect to that of the above-described embodiment. Additionally, the organic insulating film 18 functions as an etching stopper, making it possible to suppress excessive etching on a base (the insulating layer 11).

Application Example 1

The semiconductor device 1 according to the present embodiment is applied to an imaging unit (the imaging unit 2 in FIG. 18 described later), for example.

FIG. 18 illustrates a schematic cross-sectional configuration of a main part of the imaging unit 2. This imaging unit 2 includes a semiconductor chip 211, a semiconductor chip 212, and a semiconductor chip 213 in this order. The semiconductor chip 211, the semiconductor chip 212, and the semiconductor chip 213 are laminated to each other. This imaging unit 2 is a back surface irradiation type CMOS (complementary Metal Oxide Semiconductor) image sensor, for example.

The semiconductor chip 211 is provided with a sensor circuit, for example. The semiconductor chip 212 is provided with a logic circuit, for example. The semiconductor chip 213 is provided with a memory circuit, for example. The logic circuit and the memory circuit are each configured to operate to receive and output signals from and to the outside.

The semiconductor chip 211 includes a semiconductor substrate. This semiconductor substrate is provided with a photodiode (PD) 234 serving as a photoelectric conversion section in a pixel. A semiconductor well region of this semiconductor substrate is provided with source/drain regions for respective pixel transistors.

The semiconductor chip 211 includes pixel transistors Tr1 and Tr2 on a front surface of the semiconductor substrate. These pixel transistors Tr1 and Tr2 each include a gate electrode and a pair of source/drain regions. A gate insulating film is provided between the front surface of the semiconductor substrate and the gate electrode.

The pixel transistor Tr1 adjacent to the photodiode (PD) 234 corresponds to a transfer transistor. The source/drain regions thereof serve as a floating diffusion (FD).

The semiconductor chip 211 includes an interlayer insulating film. This interlayer insulating film is provided with a plurality of coupling conductors 244. The respective coupling conductors 244 are coupled to the pixel transistors Tr1 and Tr2.

The semiconductor chip 211 includes a multi-layered wiring layer 245 including metallic wiring lines 240 each including a plurality of layers. At least portions of the metallic wiring lines 240 are coupled to the coupling conductors 244. The metallic wiring lines 240 include copper (Cu) wiring lines, for example. Each of the copper wiring lines is covered with a barrier metal film to prevent Cu from diffusing, for example. A protective film serving as a cap film for the copper wiring lines is provided on the multi-layered wiring layer 245, for example.

An aluminum pad 280 serving as an electrode for external coupling is provided in a lowermost layer (a layer on the semiconductor chip 212 side) in the multi-layered wiring layer 245. That is, the aluminum pad 280 is provided at a position closer to an adhesion surface 291 to the semiconductor chip 212 than the metallic wiring lines 240. This electrode for external coupling is used as an end of a wiring line relating to signals to be inputted and outputted from and to the outside. It is to be noted that it is described here that the electrode includes aluminum. However, the electrode may include another metal.

The semiconductor chip 211 is provided with a through electrode 265 used for electrical coupling to the semiconductor chip 212. The through electrode 265 is coupled to not only a through electrode 266 of the semiconductor chip 212 described later, but also an aluminum pad 280a.

A pad hole 351 is formed on the semiconductor chip 211 to reach the aluminum pad 280a from a back surface side (a light receiving surface side) of the semiconductor chip 211.

The entire back surface of the semiconductor chip 211 is provided with an insulating protective film. A light-shielding region on the back surface of the semiconductor chip 211 is provided with a light-shielding film. Additionally, the semiconductor chip 211 includes, on a planarizing film, an on-chip color filter 274 and an on-chip micro lens 275 corresponding to each pixel.

The semiconductor chip 212 provided between the semiconductor chip 211 and the semiconductor chip 213 includes the logic circuit. The semiconductor chip 211 includes a semiconductor substrate. A p-type semiconductor well region of this semiconductor substrate is provided with MOS transistors Tr6, Tr7, and Tr8. The logic circuit includes these MOS transistors Tr6, Tr7, and Tr8.

The semiconductor chip 212 includes a plurality of coupling conductors 254. These coupling conductors 254 are coupled to the MOS transistors Tr6, Tr7, and Tr8.

The semiconductor chip 212 includes a multi-layered wiring layer 255 including metallic wiring lines 250 each including a plurality of layers. The metallic wiring lines 250 are coupled to the respective coupling conductors 254.

The metallic wiring lines 250 include copper (Cu) wiring lines, for example. A protective film serving as a cap film for the metallic wiring lines 250 is provided on the multi-layered wiring layer 255.

An aluminum pad 320 serving as an electrode is provided in a lowermost layer (a layer on the semiconductor chip 213 side) in the multi-layered wiring layer 255. That is, the aluminum pad 320 is provided at a position closer to an adhesion surface 292 to the semiconductor chip 213 than the metallic wiring lines 250.

The semiconductor chip 212 includes the through electrode 266. This through electrode 266 electrically couples the semiconductor chip 212 to the semiconductor chip 211 and the semiconductor chip 213. The through electrode 266 is coupled to not only the through electrode 265 of the semiconductor chip 211, but also an aluminum pad 330a of the semiconductor chip 213.

The semiconductor chip 213 opposed to the semiconductor chip 211 across the semiconductor chip 212 includes the memory circuit. The semiconductor chip 213 includes a semiconductor substrate. A p-type semiconductor well region of this semiconductor substrate is provided with MOS transistors Tr11, Tr12, and Tr13. The memory circuit includes these MOS transistors Tr11, Tr12, and Tr13.

The semiconductor chip 213 includes a plurality of coupling conductors 344. These coupling conductors 344 are coupled to the MOS transistors Tr11, Tr12, and Tr13.

The semiconductor chip 213 includes a multi-layered wiring layer 345 including metallic wiring lines 340 each including a plurality of layers. The metallic wiring lines 340 are coupled to the respective coupling conductors 344.

The metallic wiring lines 340 include copper (Cu) wiring lines, for example. A protective film serving as a cap film for the metallic wiring lines 340 is provided on the multi-layered wiring layer 345.

An aluminum pad 330 serving as an electrode is provided in an uppermost layer (a layer on the semiconductor chip 212 side) in the multi-layered wiring layer 345.

In this imaging unit 2, the through electrodes 265 and 266 are provided, making it possible to input and output signals between the semiconductor chips 211, 212, and 213 via the aluminum pad 280a.

For example, the through electrode structure described in the embodiment or the like described above is applied to one or both of the through electrodes 265 and 266.

Application Example 2

The imaging unit 2 above described is applicable to any type of electronic apparatuses with an imaging function including, for example, a camera system such as a digital still camera or a video camera, a mobile phone having the imaging function, and the like. FIG. 19 illustrates a schematic configuration of an electronic apparatus 3 (a camera) as an example thereof. This electronic apparatus 3 is, for example, a video camera capable of capturing a still image or a moving image. The electronic apparatus 3 includes the imaging unit 2, an optical system (optical lens) 310, a shutter unit 311, a driving section 313 that drives the imaging unit 2 and the shutter unit 311, and a signal processing section 312.

The optical system 310 guides image light (incident light) from an object to the imaging unit 2. This optical system 310 may include a plurality of optical lenses. The shutter unit 311 controls a light application period and a light shielding period of the imaging unit 2. The driving section 313 controls a transferring operation of the imaging unit 2 and a shutter operation of the shutter unit 311. The signal processing section 312 performs various kinds of signal processing on signals outputted from the imaging unit 2. An image signal Dout subjected to the signal processing is stored in a storage medium such as a memory, or outputted to a monitor or the like.

Applied Example 1

<Example of Application to In-Vivo Information Acquisition System>

Furthermore, the technology (the present technology) according to the present disclosure is applicable to various products. For example, the technology according to the present disclosure may be applied to an endoscopic surgery system.

FIG. 20 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 20, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

An example of the in-vivo information acquisition system to which the technology according to the present disclosure may be applied has been described above. The technology according to the present disclosure may be applied, for example, to the image pickup unit 10112 among the components described above. This improves detection accuracy.

Applied Example 2

<Example of Application to Endoscopic Surgery System>

The technology (present technology) according to the present disclosure is applicable to various products. For example, the technology according to the present disclosure may be applied to an endoscopic surgery system.

FIG. 21 is a view depicting an example of a schematic configuration of an endoscopic surgery system to which the technology according to an embodiment of the present disclosure (present technology) can be applied.

In FIG. 21, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photoelectrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 22 is a block diagram depicting an example of a functional configuration of the camera head 11102 and the CCU 11201 depicted in FIG. 21.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure may be applied has been described above. The technology according to the present disclosure may be applied, for example, to the image pickup unit 11402 among the components described above. Applying the technology according to the present disclosure to the image pickup unit 11402 improves detection accuracy.

It is to be noted that the endoscopic surgery system has been described here as an example, but the technology according to the present disclosure may be additionally applied to, for example, a microscopic surgery system or the like.

Applied Example 3

<Example of Application to Mobile Body>

The technology according to the present disclosure (present technology) is applicable to various products. For example, the technology according to the present disclosure may be achieved as a unit mounted on any type of a mobile body such as an automobile, an electric vehicle, a hybrid electric vehicle, a motorcycle, a bicycle, a personal mobility, an airplane, a drone, a vessel, a robot, a construction machine, and an agricultural machine (a tractor).

FIG. 23 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 23, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIGS. 13A and 13B, an audio speaker 12061, a display section 12062, and an instrument panel 12063 are illustrated as the output device. The display section 12062 may, for example, include at least one of an on-board display and a head-up display.

FIG. 24 is a diagram depicting an example of the installation position of the imaging section 12031.

In FIG. 24, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 24 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure may be applied has been described above. The technology according to the present disclosure may be applied to the imaging section 12031 among the components described above. Specifically, the imaging unit 2 in FIG. 18 is applicable to the imaging section 12031. Applying the technology according to the present disclosure to the imaging section 12031 makes it possible to obtain a captured image that is easier to see. This makes it possible to decrease fatigue of a driver.

Although description has been given above with reference to the embodiment, modification examples, and the like, the content of the present disclosure is not limited to the above-described embodiments and the like, but various modifications can be made. For example, the configuration of the semiconductor device described in the above-described embodiment is an example, and any other layer may be further included. In addition, the material and thickness of each of layers are also examples, but are not limited to those described above.

Additionally, the above-described application example 1 has been described with reference to the back surface irradiation type imaging unit 2 as an example. However, the present technology is also applicable to a front surface irradiation type imaging unit. Furthermore, the present technology is also applicable to an imaging unit having a structure layered with two semiconductor chips or four or more semiconductor chips.

In addition, in the application examples 1 and 2 described above, the examples have been described in which the semiconductor device 1 is applied to the imaging unit 2. However, the semiconductor device 1 may also be applied to another unit.

The effects described in the forgoing example embodiments are mere examples. There may be other effects, or other effects may be further included.

It is to be noted that the present disclosure may also have the following configurations.

(1)

A semiconductor device including:

a through hole forming region;

an insulating wall having an inner peripheral surface surrounding the through hole forming region;

a semiconductor substrate having the insulating wall buried in one of surfaces thereof, the semiconductor substrate having a through hole whose side wall is provided outwardly from the inner peripheral surface of the insulating wall;

a side wall insulating film covering the side wall of the through hole and the inner peripheral surface of the insulating wall; and an electric conductor provided in the through hole of the semiconductor substrate via the side wall insulating film.

(2)

The semiconductor device according to (1), in which at least a portion of the side wall of the through hole is provided at a position opposed to the insulating wall.

(3)

The semiconductor device according to (1) or (2), in which at least a portion of the side wall of the through hole is provided outwardly from the insulating wall.

(4)

The semiconductor device according to any one of (1) to (3), in which the through hole forming region has a circular shape.

(5)

The semiconductor device according to any one of (1) to (3), in which the through hole forming region has a quadrangular shape.

(6)

The semiconductor device according to any one of (1) to (5), in which the side wall of the through hole is provided vertically to the one of the surfaces of the semiconductor substrate.

(7)

The semiconductor device according to any one of (1) to (6), in which the semiconductor substrate includes a silicon substrate.

(8)

The semiconductor device according to any one of (1) to (7), in which the insulating wall includes silicon oxide (SiO), silicon nitride (SiN), silicon oxynitride (SiON), or silicon carbonitride (SiCN).

(9)

An imaging unit including:

a first semiconductor chip and a second semiconductor chip that are laminated; and a through electrode structure that electrically couples the first semiconductor chip and the second semiconductor chip, the through electrode structure including a through hole forming region, an insulating wall having an inner peripheral surface surrounding the through hole forming region, a semiconductor substrate having the insulating wall buried in one of surfaces thereof, the semiconductor substrate having a through hole whose side wall is provided outwardly from the inner peripheral surface of the insulating wall, a side wall insulating film covering the side wall of the through hole and the inner peripheral surface of the insulating wall, and an electric conductor provided in the through hole of the semiconductor substrate via the side wall insulating film.

(10)

A manufacturing method for a semiconductor device, the manufacturing method including:

forming an insulating wall having an inner peripheral surface surrounding a through hole forming region; and performing anisotropic processing and isotropic processing in this order on a semiconductor substrate to form a through hole whose side wall is provided outwardly from the inner peripheral surface of the insulating wall, the semiconductor substrate having the insulating wall buried in one of surfaces thereof.

(11)

The manufacturing method for the semiconductor device according to (10), in which during the anisotropic processing, the side wall is formed inwardly from the inner peripheral surface of the insulating wall, and through the isotropic processing, the side wall is disposed outwardly from the inner peripheral surface of the insulating wall.

This application claims the benefit of Japanese Priority Patent Application JP2017-219120 filed with Japan Patent Office on Nov. 14, 2017, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor device, comprising:
a through hole forming region;
an insulating wall that includes an inner peripheral surface, wherein
the inner peripheral surface surrounds the through hole forming region;
a semiconductor substrate that includes the insulating wall and a through hole, wherein
a side wall of the through hole is at a position outward from the inner peripheral surface of the insulating wall, and
entirety of the insulating wall is in the through hole;
a side wall insulating film that covers the side wall of the through hole and the inner peripheral surface of the insulating wall, wherein
entirety of the side wall insulating film is in the through hole, and
an interface between the side wall insulating film and the insulating wall is in the through hole; and
an electric conductor in the through hole of the semiconductor substrate, wherein
the side wall insulating film is between the electric conductor and the side wall of the through hole.

2. The semiconductor device according to claim 1, wherein a portion of the side wall of the through hole is at a position opposed to the insulating wall.

3. The semiconductor device according to claim 1, wherein a portion of the side wall of the through hole is at a position outward from the insulating wall.

4. The semiconductor device according to claim 1, wherein a shape of the through hole forming region is a circular shape.

5. The semiconductor device according to claim 1, wherein a shape of the through hole forming region is a quadrangular shape.

6. The semiconductor device according to claim 1, wherein the side wall of the through hole is in a vertical direction from one of a plurality of surfaces of the semiconductor substrate.

7. The semiconductor device according to claim 1, wherein the semiconductor substrate includes a silicon substrate.

8. The semiconductor device according to claim 1, wherein the insulating wall includes at least one of silicon oxide (SiO), silicon nitride (SiN), silicon oxynitride (SiON), or silicon carbonitride (SiCN).

9. An imaging unit, comprising:
a first semiconductor chip;
a second semiconductor chip laminated with the first semiconductor chip; and
a through electrode structure configured to electrically couple the first semiconductor chip with the second semiconductor chip, wherein
the through electrode structure includes:
a through hole forming region,
an insulating wall that includes an inner peripheral surface, wherein
the inner peripheral surface surrounds the through hole forming region,
a semiconductor substrate that includes the insulating wall and a through hole, wherein
a side wall of the through hole is at a position outward from the inner peripheral surface of the insulating wall, and
entirety of the insulating wall is in the through hole,
a side wall insulating film that covers the side wall of the through hole and the inner peripheral surface of the insulating wall, wherein
entirety of the side wall insulating film is in the through hole, and
an interface between the side wall insulating film and the insulating wall is in the through hole, and
an electric conductor in the through hole of the semiconductor substrate, wherein the side wall insulating film is between the electric conductor and the side wall of the through hole.

10. A manufacturing method for a semiconductor device, the manufacturing method comprising:
forming an insulating wall that includes an inner peripheral surface, wherein
the inner peripheral surface surrounds a through hole forming region;
performing anisotropic processing and isotropic processing in this order on a semiconductor substrate to form a through hole, wherein
a side wall of the through hole is at a position outward from the inner peripheral surface of the insulating wall,
entirety of the insulating wall is in the through hole, and
the semiconductor substrate includes the insulating wall;
forming a side wall insulating film on the side wall of the through hole, wherein
entirety of the side wall insulating film is in the through hole, and
an interface between the side wall insulating film and the insulating wall is in the through hole; and
forming an electric conductor in the through hole, wherein the side wall insulating film is between the electric conductor and the side wall of the through hole.

11. The manufacturing method for the semiconductor device according to claim 10, the manufacturing method further comprising
forming, during the anisotropic processing, the side wall at a position inward from the inner peripheral surface of the insulating wall, wherein the side wall is at the position outward from the inner peripheral surface of the insulating wall based on the isotropic processing.

* * * * *